United States Patent
Nakase et al.

(10) Patent No.: US 6,770,332 B2
(45) Date of Patent: Aug. 3, 2004

(54) METHOD FOR FORMING FILM BY PLASMA

(75) Inventors: Risa Nakase, Sagamihara (JP); Takeshi Aoki, Ebina (JP); Akira Suzuki, Sakai (JP); Yoshihiro Kato, Zama (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/573,412

(22) Filed: May 18, 2000

(65) Prior Publication Data

US 2002/0168483 A1 Nov. 14, 2002

Related U.S. Application Data

(63) Continuation of application No. PCT/JP98/05218, filed on Nov. 19, 1998.

(30) Foreign Application Priority Data

| Nov. 20, 1997 | (JP) | ............ 08-336293 |
| Nov. 27, 1997 | (JP) | ............ 08-343999 |
| Jan. 20, 1998 | (JP) | ............ 09-022718 |
| Feb. 9, 1998 | (JP) | ............ 09-042872 |

(51) Int. Cl.[7] .............. H05H 1/46; H01L 21/32; H01L 21/314; H01L 21/3115
(52) U.S. Cl. .............. 427/577; 427/490; 427/562; 427/575; 438/778; 438/784
(58) Field of Search .............. 427/577, 575, 427/525, 490, 562, 578, 574, 563, 249.7, 249.15; 438/778, 780, 784, 783

(56) References Cited

U.S. PATENT DOCUMENTS 4,663,183 A * 5/1987 Ovshinsky et al.
5,145,711 A 9/1992 Yamazaki et al.

(List continued on next page.)

FOREIGN PATENT DOCUMENTS

| EP | 1 028 457 A1 | 8/2000 |
| JP | 61-71626 | 4/1986 |
| JP | 8-64591 | 3/1996 |
| JP | 8-236517 | 9/1996 |

OTHER PUBLICATIONS

98/21747, May 22, 1998, wox.
G.Y. Lee et al., "Diamond Film Deposition by Microwave Plasma CVD Using a Mixture of $CH_4$, $H_2$, $O_2$", Journal of the Korean Ceramic Society, vol. 27, No. 4, pp. 513–520, (1990). No month.
K. Endo et al., "Fluorinated Amorphous Carbon Thin Films Grown from $C_4F_8$ for Multilevel Interconections of Integrated Circuits", NEC Research & Development, vol. 38, No. 3, pp. 287–293, (1997). July.

*Primary Examiner*—Marianne Padgett
(74) *Attorney, Agent, or Firm*—Finnegan, Henderson, Farabow, Garrett & Dunner, L.L.P.

(57) ABSTRACT

In a case where a CF film is used as an interlayer dielectric file for a semiconductor device, when a wiring of tungsten is formed, the CF film is heated to a temperature of, e g., about 400 to 450° C. At this time, F containing gases are emitted from the CF film, so that there are various disadvantages due to the corrosion of the wiring and the decrease of film thickness. In order to prevent this, it is required to enhance thermostability.

A compound gas of C and F, e.g., $C_4F_8$ gas, a hydrocarbon gas, e.g., $C_2H_4$ gas, and CO gas are used as thin film deposition gases. These gases are activated to deposit a CF film on a semiconductor wafer 10 at a process temperature of 400° C. using active species thereof. Since the number of diamond-like bonds are greater than the number of graphite-like bonds by the addition of CO gas, the bonds are strengthened and difficult to be cut even at a high temperature, so that thermostability is enhanced.

17 Claims, 24 Drawing Sheets

U.S. PATENT DOCUMENTS

| | | | | |
|---|---|---|---|---|
| 5,283,087 A | * | 2/1994 | Yamazaki et al. | 427/577 |
| 5,429,995 A | | 7/1995 | Nishiyama et al. | |
| 5,480,686 A | * | 1/1996 | Rudder et al. | 427/577 |
| 5,496,596 A | * | 3/1996 | Herb et al. | 427/577 |
| 5,510,157 A | * | 4/1996 | Chen et al. | 427/577 |
| 5,518,759 A | * | 5/1996 | Sevillano et al. | 427/577 |
| 5,559,367 A | * | 9/1996 | Cohen et al. | 257/77 |
| 5,616,373 A | * | 4/1997 | Karner et al. | 427/577 |
| 5,624,719 A | * | 4/1997 | Tanabe et al. | 427/577 |
| 5,660,894 A | * | 8/1997 | Chen et al. | 427/577 |
| 5,661,093 A | * | 8/1997 | Ravi et al. | 427/579 |
| 5,698,901 A | * | 12/1997 | Endo | 257/758 |
| 5,750,210 A | * | 5/1998 | Schmidt et al. | 427/577 |
| 5,900,290 A | * | 5/1999 | Yang et al. | 427/577 |
| 6,212,299 B1 | * | 4/2001 | Yuge | 438/682 |
| 6,215,087 B1 | | 4/2001 | Akahori et al. | |
| 6,323,119 B1 | * | 11/2001 | Xi et al. | 438/627 |
| 6,419,985 B1 | * | 7/2002 | Ishizuka | 427/577 |
| 6,458,718 B1 | * | 10/2002 | Todd | 438/778 |
| 6,534,616 B2 | * | 3/2003 | Lee et al. | 438/780 |
| 6,544,901 B1 | * | 4/2003 | Nakase | 438/780 |
| 2001/0048095 A1 | * | 12/2001 | Towle | 427/577 |

* cited by examiner

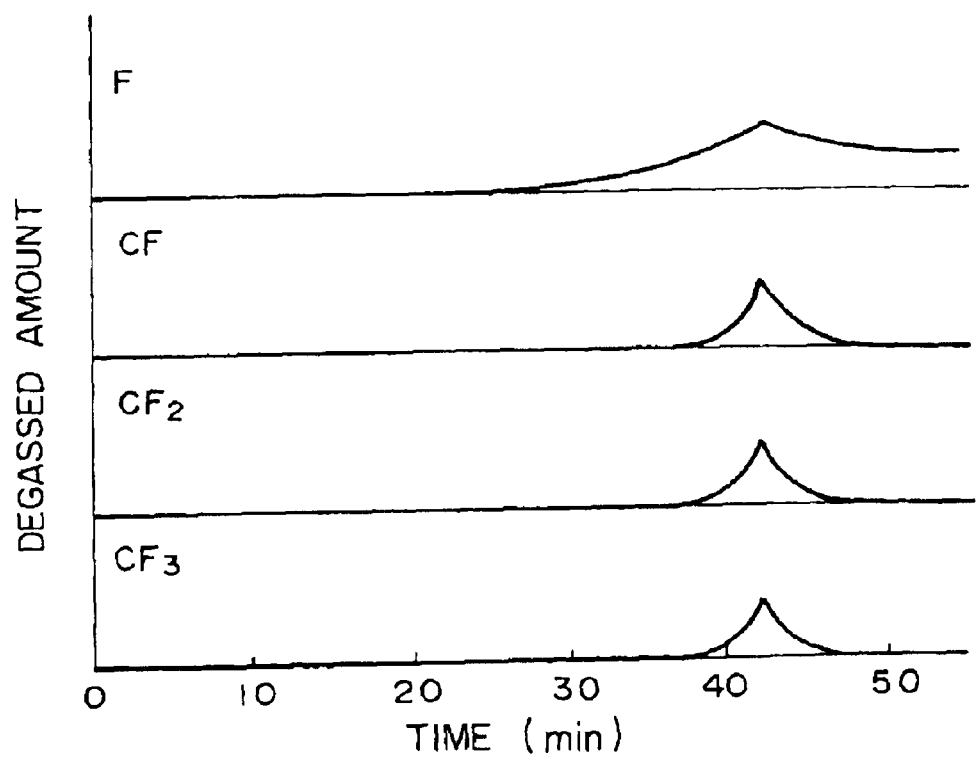
F I G. 7
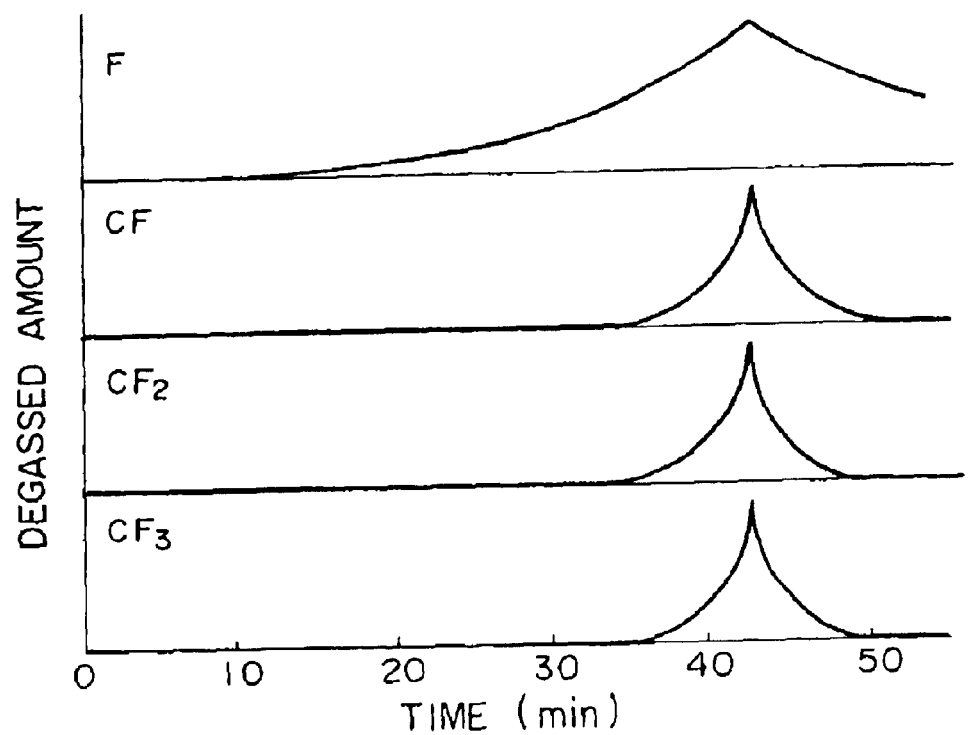
F I G. 8

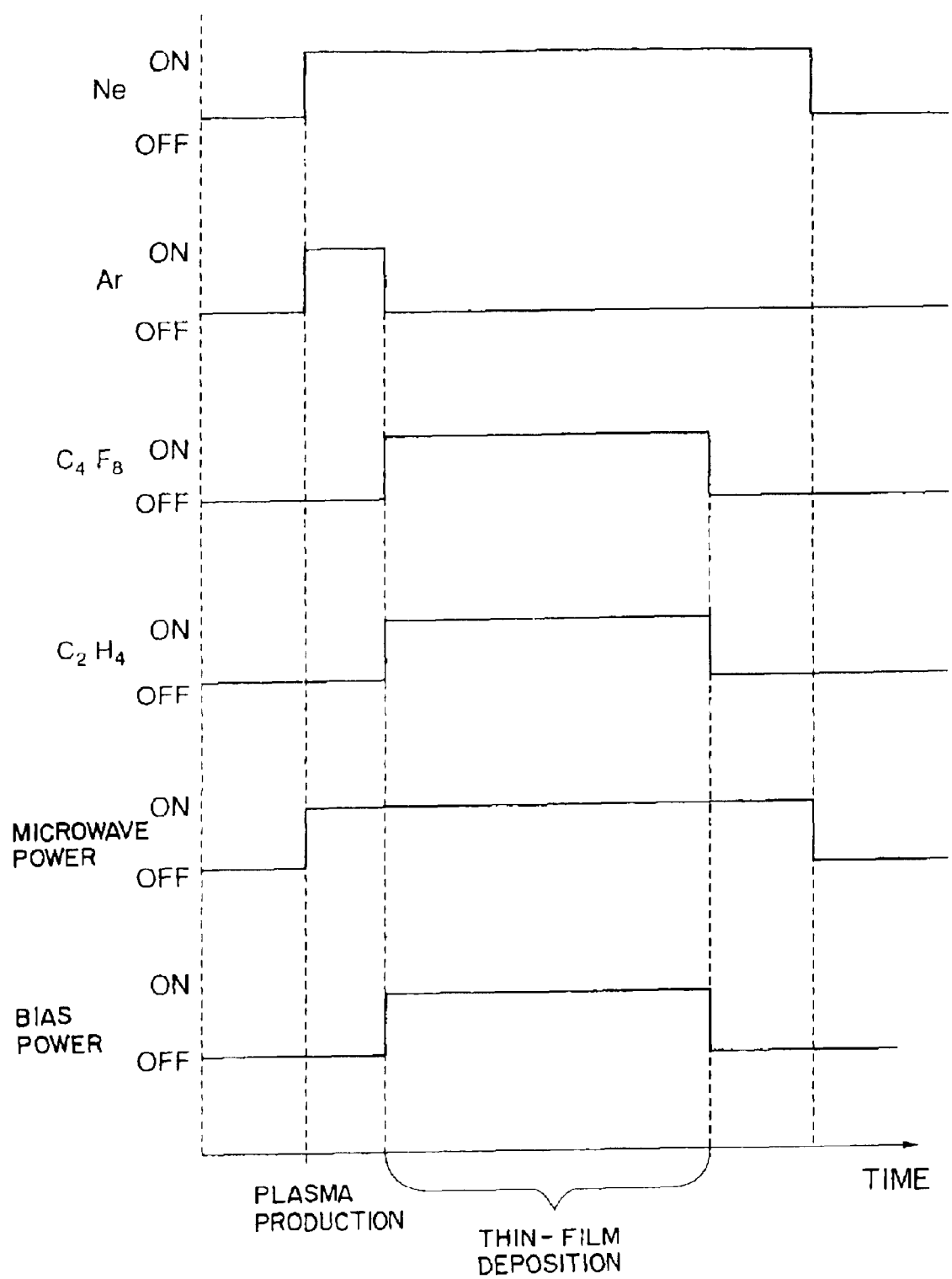
F I G. 17

| ATOM | IONIZATION POTENTIALS (V) | VOLTAGES (V) AT MINIMUM EXCITATION LEVEL |
|---|---|---|
| H | 13.59 | 10.16 |
| Ne | 21.56 | 16.53 |
| Ar | 15.76 | 11.62 |
| Kr | 13.99 | 9.98 |
| Xe | 12.13 | 8.39 |

FIG. 18

| PLASMA PRODUCING GAS | PRESENCE OF PLASMA PRODUCTION |
|---|---|
| Ne+Ar | YES |
| Ne+Kr | YES |
| Ne+Xe | YES |
| Ne | NO |

FIG. 19

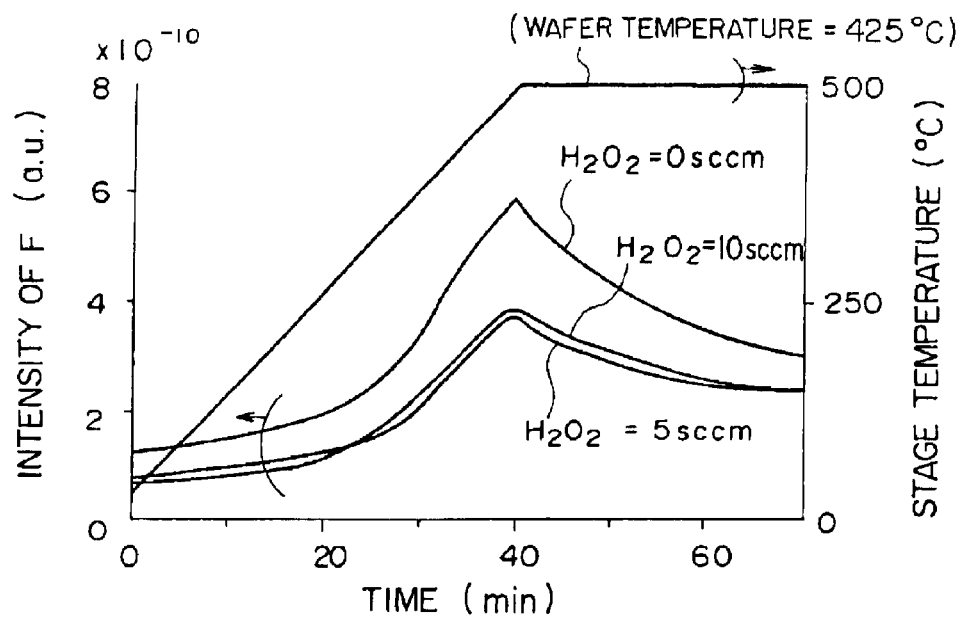
F I G. 31
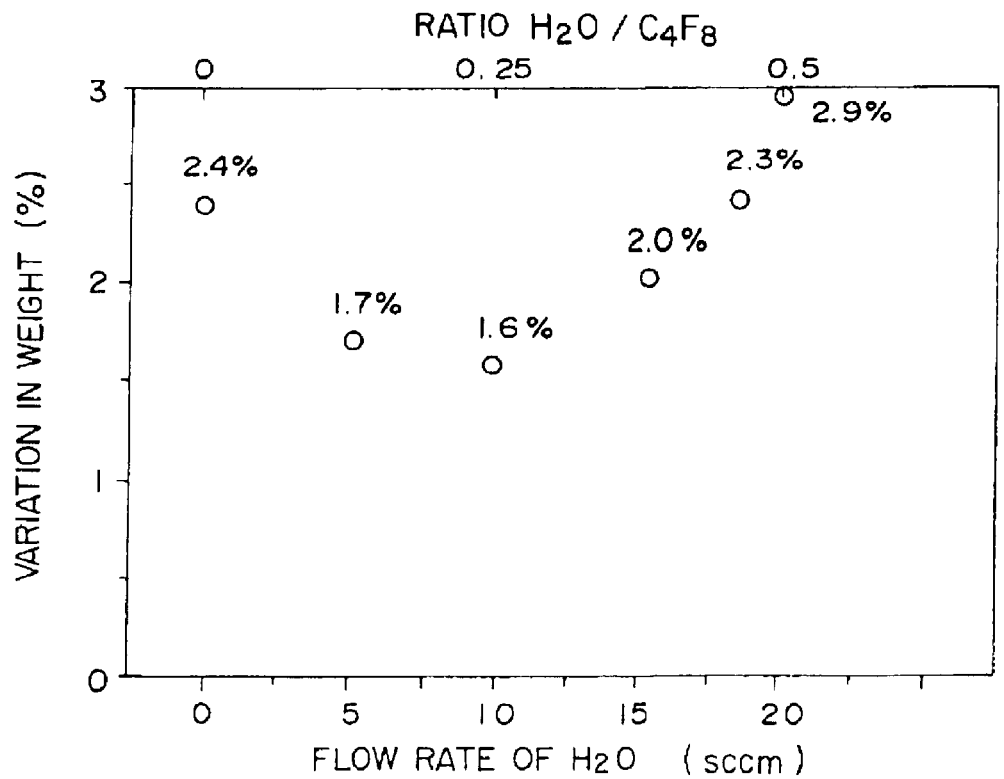
F I G. 32

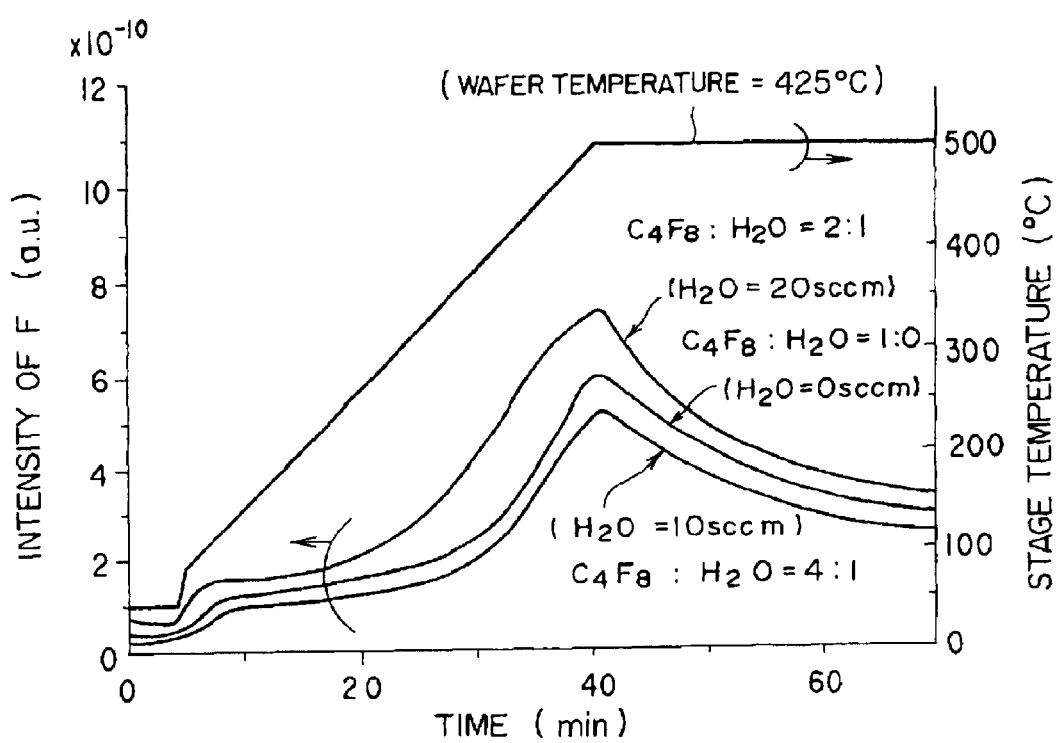
F I G. 34

US 6,770,332 B2

METHOD FOR FORMING FILM BY PLASMA

This application is a continuation of International Application No. PCT/JP98/05218, filed Nov. 19, 1998, the content of which is incorporated herein by reference.

TECHNICAL FIELD

The present invention relates to a plasma thin-film deposition method for depositing a fluorine containing carbon film, which can be used as, e.g., an interlayer dielectric film of a semiconductor device, by a plasma treatment.

BACKGROUND ART

In order to achieve the high integration of a semiconductor device, it has been developed to provide devices, such as the scale down of a pattern and the multilayering of a circuit. As one of such devices, there is a technique for multilayering wirings. In order to provide a multilevel interconnection structure, a number n wiring layer and a number (n+1) wiring layer are connected to each other by means of a conductive layer, and a thin-film called an interlayer dielectric film is formed in a region other than the conductive layer.

A typical interlayer dielectric film is an $SiO_2$ film. In recent years, in order to more accelerate the operation of a device, it has been required to reduce the relative dielectric constant of the interlayer dielectric film, and the material of the interlayer dielectric film has been studied. That is, the relative dielectric constant of an $SiO_2$ film is about 4, and it has been diligently studied to dig up materials having a smaller relative dielectric constant than that of the $SiO_2$ film. As one of such materials, it has been studied to put an SiOF film having a relative dielectric constant of 3.5 to practical use. The inventor has taken notice of a fluorine containing carbon film (which will be hereinafter referred to as a "CF film") having a still smaller relative dielectric constant. The CF film is deposited by means of, e.g., the thermal CVD (Chemical Vapor Deposition) or the plasma CVD.

Therefore, the inventor has intended to produce a CF film having high adhesion and hardness using a plasma system for producing a plasma by the electron cyclotron resonance, using gases containing, e.g., a compound gas of carbon (C) and fluorine (F) and a hydrocarbon gas, as thin-film deposition gases, on various process conditions.

However, the CF film has the following problems. FIG. 6 shows a part of a circuit part formed on a wafer, wherein reference numbers 11 and 12 denote CF films, 13 and 14 denoting conductive layers of W (tungsten), 15 denoting a conductive layer of Al (aluminum), 16 denoting an $SiO_2$ film, into which P and B have been doped, and 17 denoting an n-type semiconductor region. The W layer 13 is formed at a process temperature of 400 to 450° C. At this time, the CF films 11 and 12 are heated to the process temperature. However, if the CF films are heated to such a high temperature, a part of C—F bonds are cut, so that F contag gases are mainly desorbed. The F containing gasses include F, CF, $CF_2$ gases and so forth.

If the F containing gases are thus desorbed, there are the following problems.
(a) The metal wirings of aluminum, tungsten and so forth are corroded.
(b) Although the insulator film also has the function of pressing the aluminum wiring to prevent the swell of aluminum, the pressing force of the insulator film on the aluminum wiring is decreased by degassing. As a result, the aluminum wiring swells, so that an electrical defect called electromigration is easily caused.
(c) The insulator film cracks, so that the insulation performance between the wirings gets worse. When the extent of the crack increases, it is not possible to form a wiring layer at the next stage.
(d) if the amount of desorbed F increases, the relative dielectric constant increases.

DISCLOSURE OF THE INVENTION

It is therefore an object of the present invention to eliminate the aforementioned problems and to provide a plasma thin-film deposition method capable of depositing an insulator film of a CF film, which has strong bonds and high thermostability, e.g., an interlayer dielectric film of a semiconductor device.

According to one aspect of the present invention, according to a first aspect of the present invention, a plasma thin-film deposition method comprises the steps of: activating a thin-film deposition gas containing a compound gas of carbon and fluorine and an oxygen containing gas to form a plasma; and depositing a fluorine containing carbon film on a substrate to be treated, with the plasma.

The oxygen containing gas may be carbon monoxide gas. Alternatively, the oxygen containing gas may be carbon dioxide gas. The oxygen containing gas may also be oxygen gas. In addition, the oxygen containing gas may be water gas. Moreover, the oxygen containing gas may be hydrogen peroxide gas. The thin-film deposition gas may include a hydrocarbon gas. In addition, the thin-film deposition gas may be activated by the interaction between a microwave and a magnetic field to form a plasma.

According to a second aspect of the present invention, a plasma thin-film deposition method comprises the steps of: activating a thin-film deposition gas containing a compound gas of carbon and fluorine and a silicon containing gas to form a plasma; and depositing a fluorine containing carbon film on a substrate to be treated, with the plasma. The silicon containing gas may be a compound gas of silicon and hydrogen. Alternatively, the silicon containing gas may be a compound gas of silicon and fluorine.

According to the second aspect of the present invention, a plasma thin-film deposition method comprises the steps of: activating a thin-film deposition gas containing a compound gas of carbon and fluorine, a hydrocarbon gas and silicon gas to form a plasma; and depositing a fluorine containing carbon film on a substrate to be treated, with the plasma. The thin-film deposition gas may include a hydrocarbon gas. The silicon containing gas may be a compound gas of silicon and hydrogen. Alternatively, the silicon containing gas may be a compound gas of silicon and fluorine.

According to a third aspect of the present invention, a plasma thin-film deposition method comprises the steps of: activating a thin-film deposition gas containing $C_4F_8$ gas and acetylene gas to form a plasma; and depositing a fluorine containing carbon film on a substrate to be treated, with the plasma. The flow ratio of $C_4F_8$ gas to acetylene gas may be $4/7 \leq C_4F_8$ gas/acetylene gas$\leq 1$.

According to a fourth aspect of the present invention, a plasma thin-film deposition method comprises the steps of: activating a thin-film deposition gas containing $C_4F_8$ gas, acetylene gas and hydrogen gas to form a plasma; and depositing a fluorine containing carbon film on a substrate to be treated, with the plasma, wherein the flow ratio of $C_4F_8$ gas to acetylene gas is $0.7 \leq C_4F_8$ gas/acetylene gas$\leq 4/3$, and the flow ratio of the mixed gas of $C_4F_8$ gas and acetylene gas to hydrogen gas is $1 \leq$ the mixed gas/hydrogen gas$\leq 3$.

According to the first through fourth aspects of the present invention, it is possible to produce a CF film which has high thermostability and small desorption of F containing gases. Therefore, if this CF film is used as, e.g., an interlayer dielectric film of a semiconductor device, it is possible to prevent the corrosion of a metal wiring, the swell of an aluminum wiring and the crack of the film. Since the scale down and accelerating of semiconductor devices have been required and since CF films have been widely noticed as insulator films having a small relative dielectric constant, the present invention is effective in the practical use of CF films as insulator films.

BRIEF DESCRIPTION OF THE DRAWINGS

FIG. 7 is a characteristic diagram showing the TDS spectrum of a CF film when $SiH_4$ gas is added as a thin-film deposition gas;

FIG. 8 is a characteristic diagram showing the TDS spectrum of a CF film when $SiH_4$ gas is not added as a thin-film deposition gas;

FIG. 17 is another example of a sequence diagram in the fourth preferred embodiment of the present invention;

FIG. 18 is a characteristic diagram showing the ionization potentials and voltages at the minimum excitation level of rare gases;

FIG. 19 is a characteristic diagram showing the relationship between plasma producing gases and the presence of plasma production;

FIG. 31 is a diagram showing the intensity of an F out gas (a.u.) (TDS spectrum), which is shown on the left axis of ordinates, with respect to time (min) when the stage temperature (° C.) rises with respect to time (min) as shown on the right axis of ordinates in a case where the flow rate (sccm) of $H_2O_2$ gas varies;

FIG. 32 is a diagram showing the variation (%) in weight of a CF film when the flow rate (sccm) of $H_2O$ gas varies;

FIG. 34 is a diagram showing the intensity of an F out gas (a.u.) (TDS spectrum), which is shown on the left axis of ordinates, with respect to time (min) when the stage temperature (° C.) rises with respect to time (min) as shown on the right axis of ordinates in a case where the flow rate (socm) of $H_2O$ gas varies;

BEST MODE FOR CARRYING OUT THE INVENTION

Figure 1:
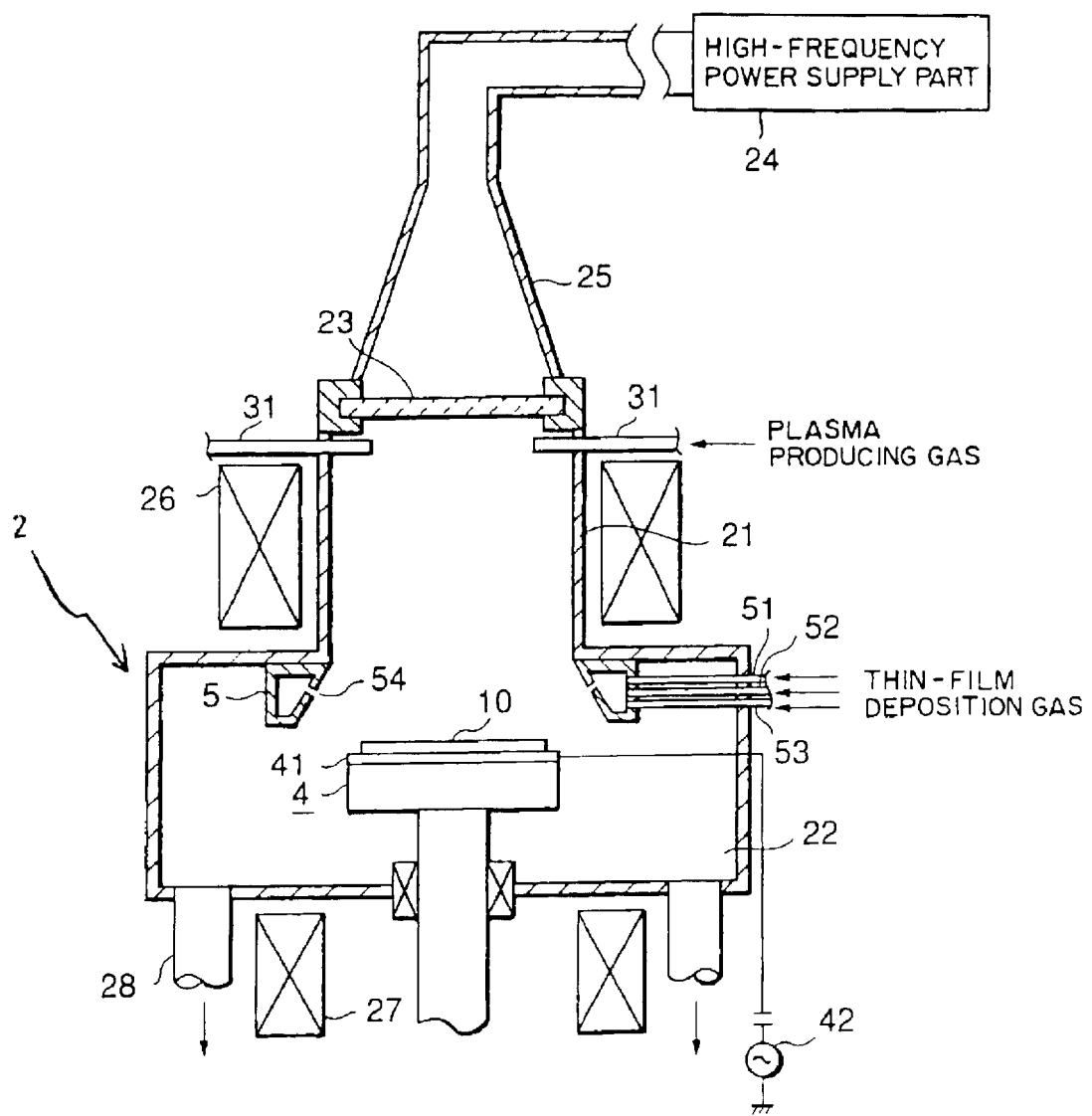
FIG. 1 is a longitudinal section of an example of a plasma treatment system for caring out a method according to the present invention.

FIG. 1 shows an example of a plasma treatment system for use in the preferred embodiments of the present invention. This system has a vacuum vessel 2 of, e.g., aluminum. The vacuum vessel 2 comprises a first cylindrical vacuum chamber 21, which is arranged in an upper portion for producing a plasma, and a second cylindrical vacuum chamber 22, which is communicated with and connected to the lower portion of the first vacuum chamber 21 and which has a greater diameter than that of the first vacuum chamber 21. Furthermore, the vacuum vessel 2 is grounded to have a zero potential.

The upper end of the vacuum vessel 2 is open. A transmission window 23 of a microwave permeable material, e.g., quartz, is airtightly provided in the open upper end of the vacuum vessel 2 so as to hold vacuum in the vacuum vessel 2. Outside of the transmission window 23, there is provided a waveguide 25 connected to a high-frequency power supply part 24 for producing a microwave of, e.g., 2.45 GHz. The microwave produced by the high-frequency power supply part 24 is guided by the waveguide 25 in, e.g., a TE mode, or the microwave guided in the TE mode is converted by the waveguide 25 into a TM mode, to be introduced from the transmission window 23 into the first vacuum chamber 21.

In the side wall defining the first vacuum chamber 21, gas nozzles 31 are arranged at regular intervals along, e.g., the periphery thereof. The gas nozzles 31 are connected to a plasma producing gas source (not shown), e.g., an Ar gas source, and a hydrogen plasma producing gas source, e.g., an $H_2$ (hydrogen) gas source, so that a plasma producing gas, e.g., Ar gas or $H_2$ gas, can be uniformly supplied to the upper portion in the first vacuum chamber 21.

In the second vacuum chamber 22, a mounting table 4 for a semiconductor wafer (which will be hereinafter referred to as a "wafer") is provided so as to face the first vacuum chamber 21. The mounting table 4 has an electrostatic chuck 41 on the surface thereof. The electrode of the electrostatic chuck 41 is connected to a dc power supply (not shown) for absorbing a wafer and to a high-frequency power supply part 42 for applying a bias voltage for implanting ions into the wafer.

On the other hand, in the upper portion of the second vacuum chamber 22, i.e., in a portion of the second vacuum chamber 22 communicated with the first vacuum chamber 21, a ring-shaped thin-film deposition gas supply part 5 is provided. For example, two kinds of thin-film deposition gases, which include a compound gas of C and F, e.g., $C_4F_8$ gas, and a hydrocarbon gas, e.g., $C_2H_4$ gas, are supplied from gas supply pipes 51 and 52 to the thin-film deposition gas supply part 5, so that the mixed gas thereof is supplied to the vacuum vessel 2 via gas holes 53 formed in the inner peripheral surface of the thin-film deposition gas supply part 5.

In the vicinity of the outer periphery of the side wall defining the first vacuum chamber 21, a magnetic field forming means, e.g., a ring-shaped main electromagnetic coil 26, is arranged. Below the second vacuum chamber 22, a ring-shaped auxiliary electromagnetic coil 27 is arranged. To the bottom of the second vacuum chamber 22, exhaust pipes 28 are connected at, e.g., two positions which are symmetrical with respect to the central axis of the vacuum chamber 22.

The first through fourth preferred embodiments of a plasma treatment method for a wafer 10, which is a substrate to be treated, using the system shown in FIG. 1 according to the present invention will be described below.

First, the first preferred embodiment of the present invention will be described below.

A method for depositing an interlayer dielectric film of a CF film on a wafer 10, which is a substrate to be treated, using the system shown in FIG. 1 will be described. First, a gate valve (not shown) provided in the side wall of the vacuum vessel 2 is open, and a wafer 10, on which a wiring of, e.g., aluminum, has been formed, is introduced from a load-lock chamber (not shown) by means of a transport arm (not shown) to be mounted on the mounting table 4 to be electrostatically absorbed by means of the electrostatic chuck 41.

Subsequently, after the gate valve is closed to seal the interior of the vacuum vessel 2, the internal atmosphere is exhausted by the exhaust pipes 28, and the interior of the vacuum vessel 2 is evacuated to a predetermined degree of vacuum. Then, Ar gas is introduced from the plasma gas nozzles 31 into the first vacuum chamber 21 at a predetermined flow rate, and a thin-film deposition gas is introduced from the thin-film deposition gas supply part 5 into the second vacuum chamber 22 at a predetermined flow rate.

This preferred embodiment is characterzed by the thin-film deposition gas. As the thin-film deposition gas, a compound gas of C and F (which will be hereinafter referred to as a "CF containing gas"), e.g., $C_4F_8$ gas, a hydrocarbon gas, e.g., $C_2H_4$ gas, and an oxygen containing gas, e.g., carbon monoxide (CO) gas, carbon dioxide ($CO_2$), oxygen gas ($O_2$), water ($H_2O$) or hydrogen peroxide ($H_2O_2$), are used. These gasses are supplied to the vacuum vessel 2 via the thin-film deposition gas supply part 5 from the gas supply pipes 51 through 53, respectively.

Then, the interior of the vacuum vessel 2 is held under a predetermined process pressure, and a bias voltage of 13.56 MHz and 1500 W is applied to the mounting table 4 by means of the high-frequency power supply part 42. In addition, the surface temperature of the mounting table 4 is set to be about 400° C.

On the other hand, a high-frequency wave (a microwave) of 2.45 GHz and 2700 W from the high-frequency power supply part 24 passes through the waveguide 25 to reach the ceiling of the vacuum vessel 2, and passes through the transmission window 23 to be introduced into the first vacuum chamber 21. In addition, a magnetic field extending from the upper portion of the first vacuum chamber 21 to the lower portion of the second vacuum chamber 22 is formed in the vacuum vessel 2 by the main electromagnetic coil 26 and the auxiliary electromagnetic coil 27. The intensity of the magnetic field is, e.g., 875 gausses, in the vicinity of the lower portion of the first vacuum chamber 21. Thus, the electron cyclotron resonance is produced by the interaction between the magnetic field and the microwave. By this resonance, Ar gas is activated as plasma and enriched.

The plasma thus produced flows from the first vacuum chamber 21 into the second vacuum chamber 22 to activate $C_4F_8$ gas, $C_2H_4$ gas and the oxygen containing gas, which have been supplied thereto, to form active species to deposit a CF film on the wafer 10. Thereafter, when a device is actually produced, the CF film is etched with a predetermined pattern, and a W film is embedded in a groove portion to form a W wig.

The CF film thus deposited has strong bonds, and high thermostability as can be seen from the results of experiments which will be described later. That is, the amounts of desorbed F containing gases are small even at a high temperature.

It is considered that the reason for this is as follows. A case where carbon monoxide (CO) gas is adopted as the oxygen containing gas will be described as an example.

If a CF containing gas and a hydrocarbon gas are combined as a thin-film deposition gas to form a CF film, it is considered that C—C bonds having a structure approximating to the graphite structure (which will be hereinafter referred to as "graphite-like bonds"), C—C bonds having a structure approximating to the diamond structure (which will be hereinafter referred to as "diamond-like bonds"), and unreacted substances incorporated in the CF film exist in the CF film.

On the other hand, it is guessed that if an oxygen containing gas, such as CO gas, is added to the mixture of a CF containing gas and a hydrocarbon gas, the oxygen containing gas, such as CO gas, reacts with the graphite-like bonds and unreacted substances to oxidize and remove the graphite-like bonds and so forth, so that the diamond-like bonds remain to increase the proportion of the diamond-like bonds to the graphite-like bonds.

Figure 2:
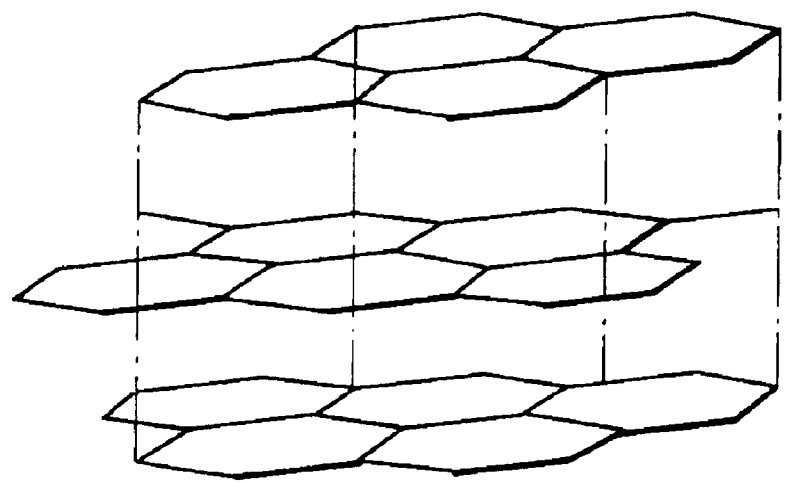
FIG. 2 is a schematic diagram for explaining the graphite structure.
Figure 3:
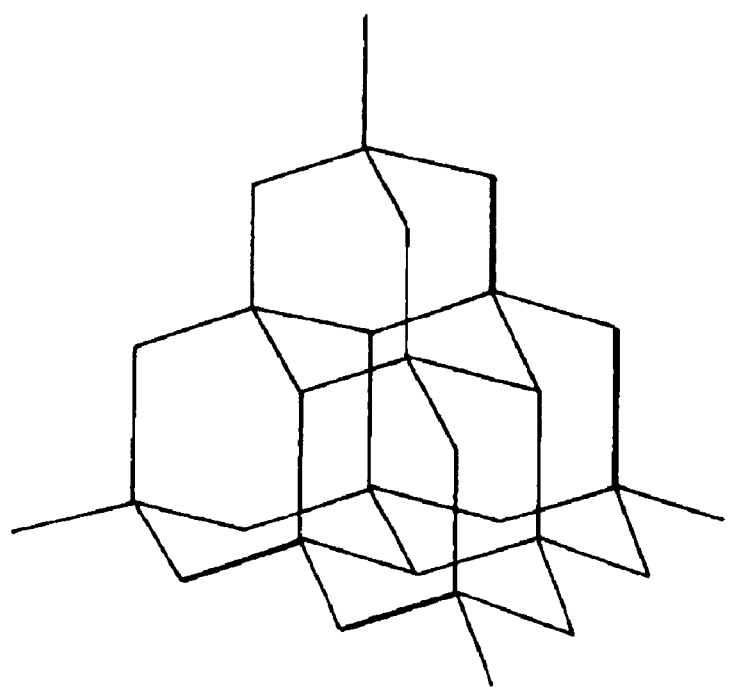
FIG. 3 is a schematic diagram for explaining the diamond structure.

The graphite structure and the diamond structure will be briefly described. As shown in FIG. 2, the graphite structure is a structure wherein six-carbon rings, each of which is formed by the bonds of C atoms, are laminated. As shown in FIG. 3, the diamond structure is a structure wherein four C atoms are coordinated with a C atom to form a tetrahedron. Comparing the graphite structure with the diamond structure, the graphite structure is a laminated structure and has a low bonding strength between the surfaces of layers, whereas the diamond structure is a three-dimensional structure so that the whole crystal is regarded as a macromolecule, and has a high bonding strength.

Therefore, if the proportion of the diamond-like bonds to the graphite-like bonds is increased by adding the oxygen contain gas, such as CO gas, the number of strong bonds increases. The desorption of F occurs when C—C bonds are cut by heat during a heat treatment at a high temperature so that F, CF and $CF_2$ scatter as gases. It is considered that if the bonds are strengthen by the increase of the proportion of the diamond-like bonds as described above, the bonds are difficult to be cut even at a high temperature, so that the thermostability of the CF film is enhanced.

Comparing Examples with Comparative Examples, the advantages of the method of the present invention will be described below. First, a case where CO gas is adopted as the oxygen containing gas will be described below.

EXAMPLE 1

Using the plasma treatment system shown in FIG. 1, a CF film having a thickness of 2 μm was deposited on the wafer 10 by introducing Ar gas as a plasma producing gas at a flow rate of 150 sccm, and $C_4F_8$ gas, $C_2H_4$ gas and CO gas as thin-film deposition gases at flow rates of 40 sccm, 30 sccm and 2 sccm, respectively. The microwave power (the high-frequency power supply part 24) and the bias power (the high-frequency power supply part 42) were set to be 2700 W and 1500 W, respectively. In addition, the temperature of the surface of the mounting table 4 was set to be 400° C., and the process pressure was set to be 0.2 Pa.

EXAMPLE 2

Using the plasma treatment system shown in FIG. 1, a CF film having a thickness of 2 μm was deposited on the wafer 10 by introducing Ar gas as a plasma producing gas at a flow rate of 150 sccm , and $C_4F_8$ gas, $C_2H_4$ gas and CO gas as thin-film deposition gases at flow rates of 40 sccm, 30 sccm and 2 sccm, respectively. The microwave power and the bias power were set to be 2700 W and 1500 W, respectively. In addition, the temperature of the surface of the mounting table 4 was set to be 420° C., and the process pressure was set to be 0.2 Pa

EXAMPLE 3

Using the plasma treatment system shown in FIG. 1, a CF film having a thickness of 2 μm was deposited on the wafer 10 by introducing Ar gas as a plasma producing gas at a flow rate of 30 sccm, and $C_4F_8$ gas, $C_2H_4$ gas and CO gas as thin-film deposition gases at flow rates of 40 sccm, 30 sccm and 2 sccm, respectively. The microwave power and the bias power were set to be 2700 W and 1500 W, respectively. In addition, the temperature of the surface of the mounting table 4 was set to be 400° C., and the process pressure was set to be 0.1 Pa.

Comparative Example

Using the plasma treatment system shown in FIG. 1, a CF film having a thickness of 2 μm was deposited on the wafer 10 by introducing Ar gas as a plasma producing gas at a flow rate of 150 sccm, and $C_4F_8$ gas and $C_2H_4$ gas as thin-film deposition gases at flow rates of 40 sccm and 30 sccm, respectively. The microwave power and the bias power were set to be 2700 W and 1500 W, respectively. In addition, the temperature of the surface of the mounting table 4 was set to be 400° C., and the process pressure was set to be 0.2 Pa.

Figure 4:
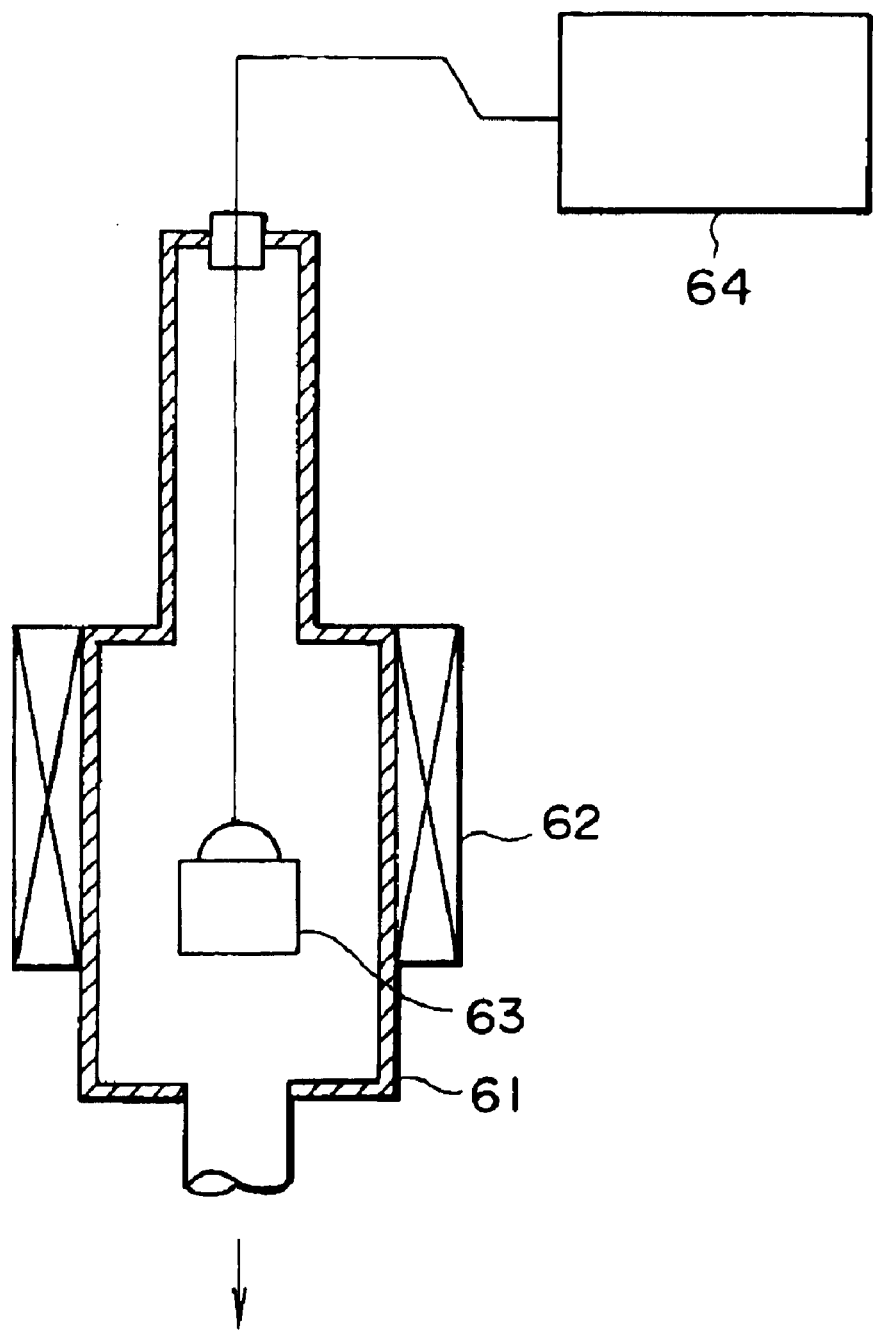
FIG. 4 is a schematic sectional view of a measuring device for examining the variation in weight of a thin-film.

Using a measuring device shown in FIG. 4, the variations in weight of the deposited CF films at a high temperature were examined as indexes of the thermostability of the thin-film. As a measuring method, there was adopted a method for shaving the CF film on the wafer to put the shaven CF film in a crucible 63 to raise the temperature in the crucible 63 to 425° C. under an atmosphere of nitrogen to heat the CF film for 2 hours to examine the variation in weight in a weight measuring part 64.

The variation in weight means a value of $\{(A-B)/A\} \times 100$ assuming that the weight of the thin-film in the crucible before heating is A and the wit of the thin-film in the crucible after heating is B. When this value is small, the desorption of F containing gasses is small, and thermostability is high.

As a result, the variation in weight of the CF film deposited on the process conditions in Example 1 was 2.3%, and the variation in weight of the CF film deposited on the process conditions in Example 2 was 1.7%. In addition, the variation in weight of the CF film deposited on the process conditions in Example 3 was 2.0%, and the variation in weight of the CF film deposited on the process conditions in Comparative Example was 4.4%. Thus, it can be understood that if CO gas is added, the variation in weight of the deposited CF film reduces, so that the desorption of F containing gases decrease to enhance thermostability.

Figure 5:
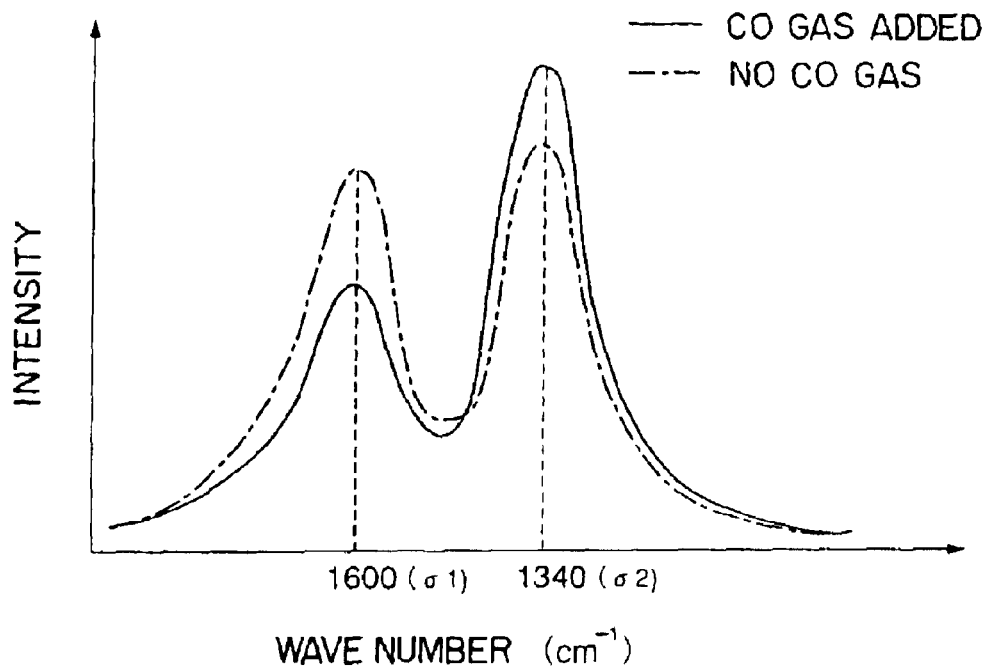
FIG. 5 is a characteristic diagram showing the Raman spectrum of a CF film.
Figure 6:
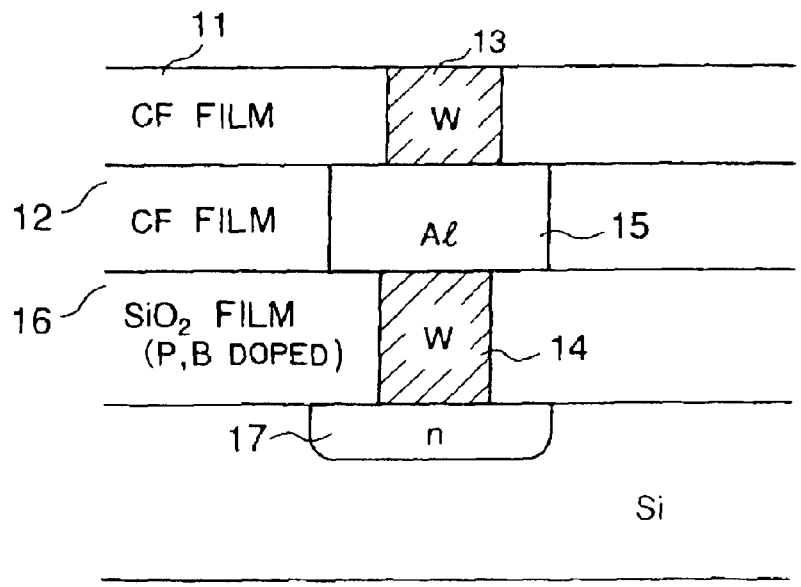
FIG. 6 is a structural drawing showing an example of the structure of a semiconductor device.

The CF film deposited on the process conditions in Example 1 and the CF film deposited on the process conditions in Comparative Example were analyzed by the Raman spectrometry. The results thereof are shown in FIG. 5. In the drawing, the curve shown by a chain line represents the Raman spectrum of the CF film deposited on the process conditions in Comparative Example, i.e., when no CO gas is added, and the curve shown by a solid line represents the Raman spectrum of the CF film deposited on the process conditions, i.e., when CO gas is added.

Each of these spectra has two peaks. One peak at a wave number of 1600 $cm^{-1}$ (σ1) is derived from the graphite-like bonds, and the other peak at a wave number of 1340 $cm^{-1}$ (σ2) is derived from the diamond-like bonds. The intensities of these peaks are in proportion to the number of the bonds, respectively. Therefore, it can be understood that if no CO gas is added, the numbers of the graphite-like bonds and the diamond-like bonds are substantially equal to each other, whereas if CO gas is added, the number of the graphite-like bonds decreases and the number of the diamond-like bonds increases.

Figure 20:
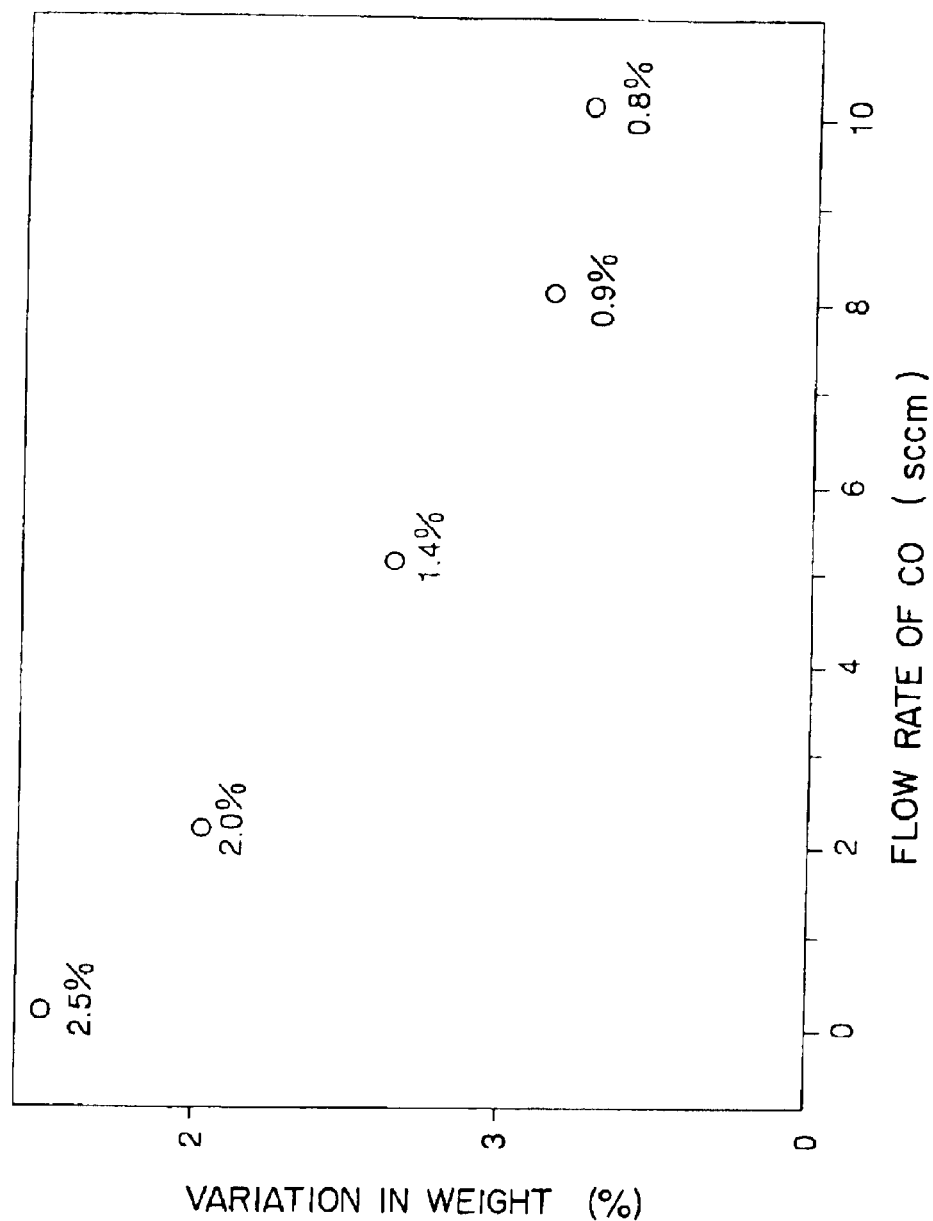
FIG. 20 is a diagram showing the variation in weight of a CF film when the flow rate (sccm) of CO varies.
Figure 21:
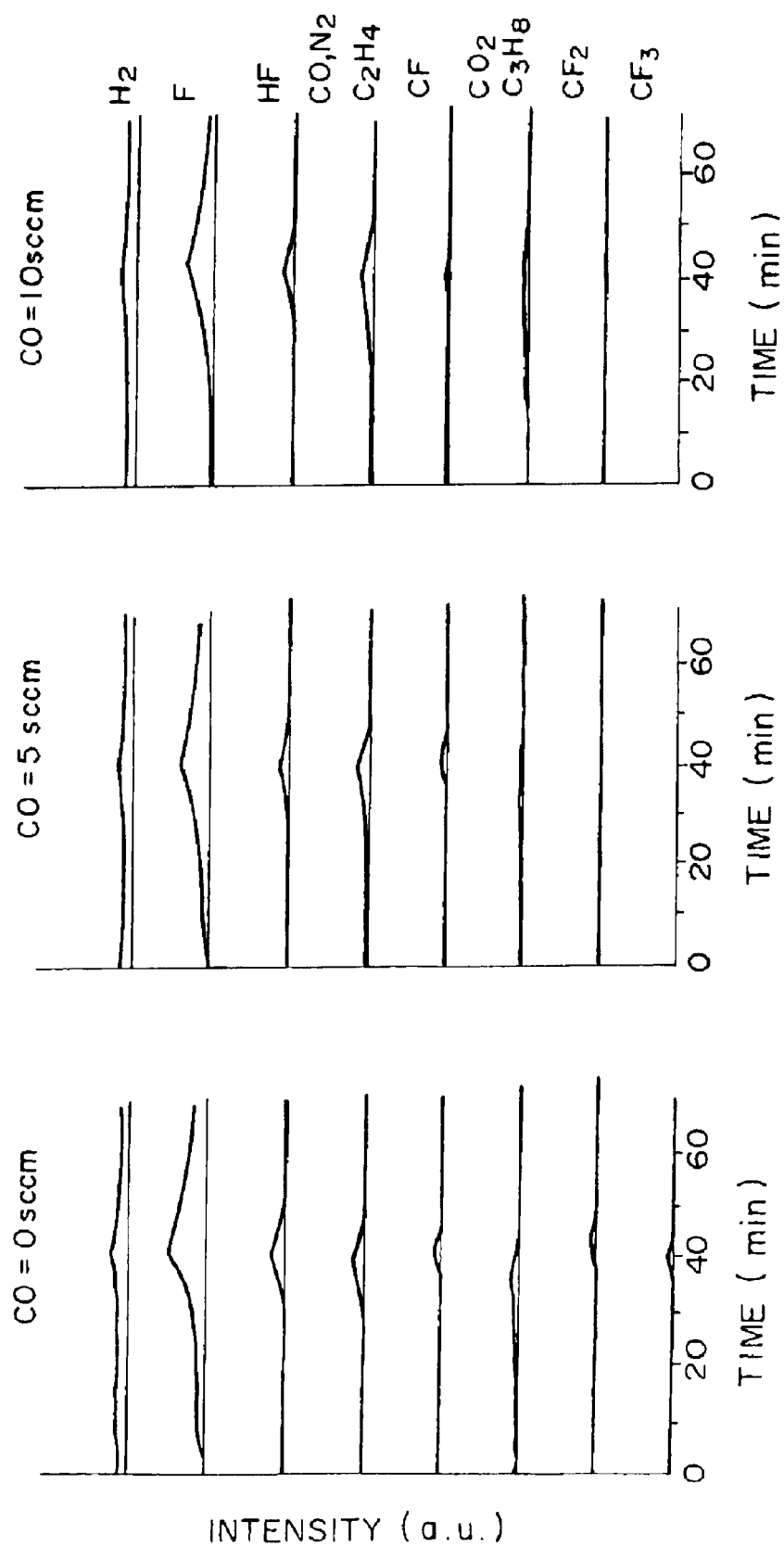
FIG. 21 is a diagram showing the intensity distributions in spectra of out gases when the flow rate (sccm) of CO gas varies.
Figure 22:
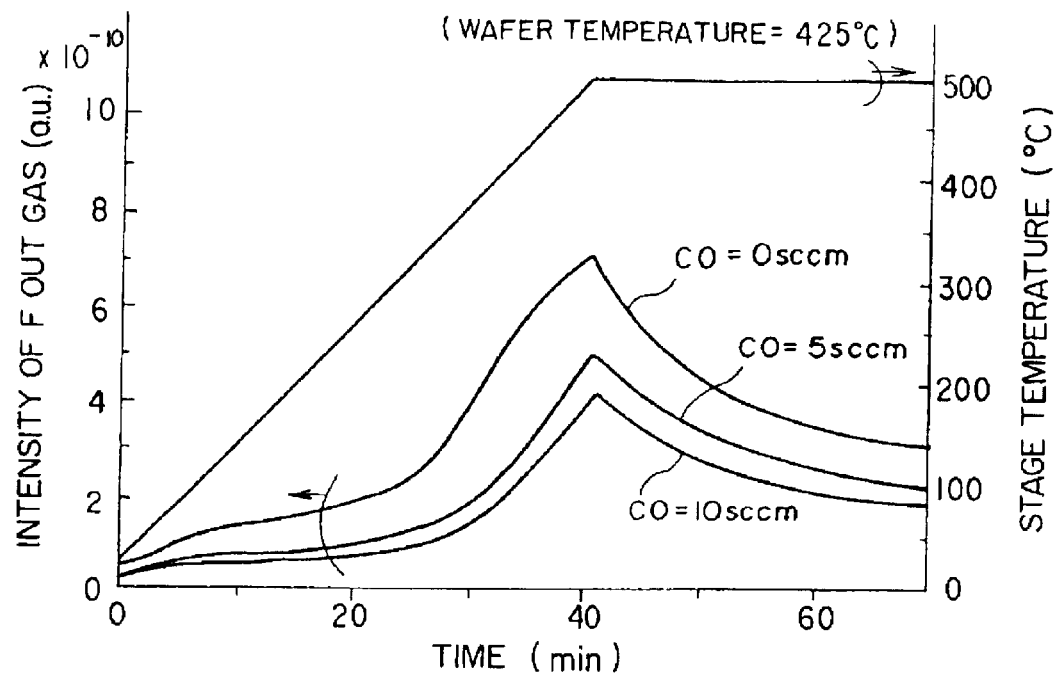
FIG. 22 is a diagram showing the intensity of an F out gas (a.u.) (TDS spectrum), which is shown on the left axis of ordinates, with respect to time (min) when the stage temperature (° C.) rises with respect to time (min) as shown on the right axis of ordinates in a case where the flow rate (sccm) of CO gas varies.

Referring to FIGS. 20 through 22, the results of measurements of CF films deposited by using CO gas as an oxygen containing gas at various flow rates (sccm) will be described in detail below. Using the plasma treatment system shown in FIG. 1, a CF film having a thickness of 2 μm was deposited on the wafer 10 by introducing Ar gas as a plasma producing gas at a flow rate of 30 sccm, and $C_4F_8$ gas (40 sccm), $C_2H_4$ gas (30 sccm) and CO gas as thin-film deposition gases. The microwave power (the high-frequency power supply part 24) and the bias power (the high-frequency power supply part 42) were set to be 2700 W and 1500 W, respectively, and the temperature of the surface of the mounting table 4 was set to be 400° C.

FIG. 20 shows the variation (%) in weight of the CF film examined by means of the measuring device shown in FIG. 4 when the flow rate (sccm) of CO gas varies. When the flow rates of CO gas were 0 sccm, 2 sccm, 5.0 sccm, 8 sccm and 10 sccm, the variations in weight were 2.5%, 2.0%, 1.4%, 0.9% and 0.8%, respectively. It can be understood that the variation (%) in weight decreases as the flow rate (sccm) of CO gas increases.

FIG. 21 shows the intensity distributions of the TDS (Thermal Desorption Spectroscopy) spectra of $H_2$, F, HF, CO, $N_2$, $C_2H_4$, CF, $CO_2$, $C_3H_8$, $CF_2$ and $CF_3$ when the flow rates of CO gas are 0 sccm, 5 sccm and 10 sccm. This measurement was carried out by a mass spectrometer connected to a vacuum vessel, in which a predetermined amount of thin-film was put and the interior of which was heated to 425° C. In FIG. 21, the axis of ordinates denotes dimensionless amounts corresponding to the intensities of spectra, and the peaks thereof denote the amounts of desorbed gases. In addition, the axis of abscissas denotes time after the temperature rise in the vacuum vessel begins. The temperature rises at a rate of 10° C./min from room temperature. After the temperature reaches 425° C., it is held for 30 minutes. It can be seen from FIG. 21 that the amounts of desorbed CF, $CF_2$ and $CF_3$ decrease as the flow rate of CO gas increases. It is guessed from these results that C—C bonds are difficult to be cut when the thin-film deposition gas includes an oxygen containing gas.

FIG. 22 shows the intensity of an F out gas (a.u.), which is shown on the left axis of ordinates, with respect to time (min) when the stage temperature (° C.) of a measuring stage, on which a predetermined amount of CF film is put, rises with respect to time (min) as shown on the right axis of ordinates in a case where the flow rates (sccm) of CO gas are 0 sccm, 5 sccm and 10 sccm. When the stage temperature is 500° C., the temperature of the wafer is 425° C. It can be seen from FIG. 22 that the intensity of the F out gas decreases as the flow rate of CO gas increases.

It can be understood from FIGS. 20 through 22 that if CO gas is adopted as an oxygen containing gas, the variation in weight of the deposited CF film decreases by adding CO gas, so that the amounts of desorbed F containing gases decrease to enhance thermostability.

Figure 23:
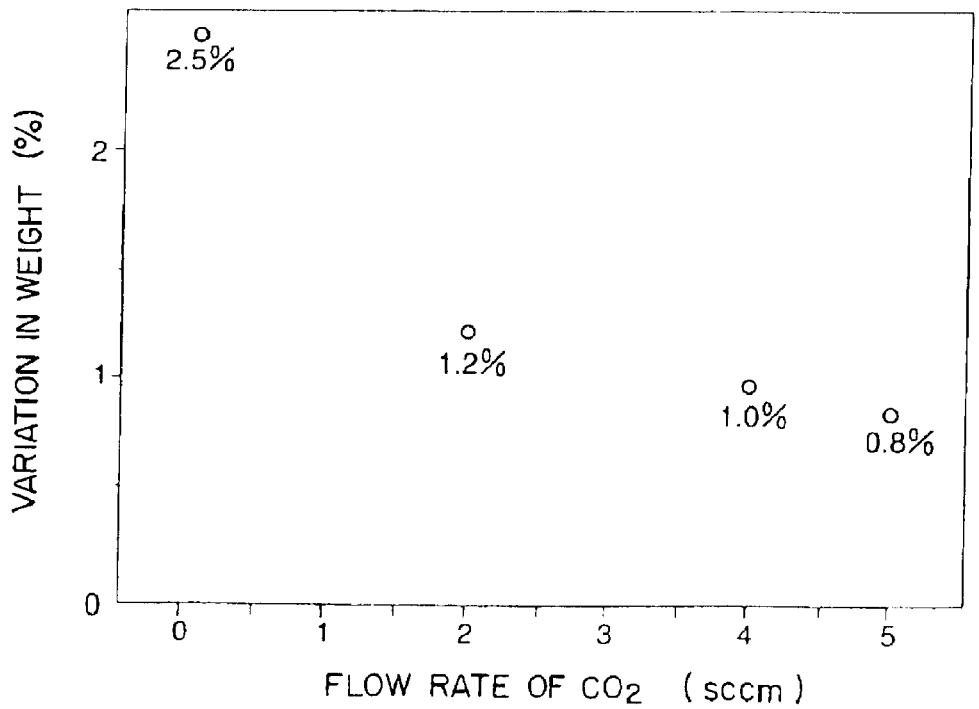
FIG. 23 is a diagram showing the variation (%) in weight of a CF film when the flow rate (sccm) of $CO_2$ gas varies.
Figure 24:
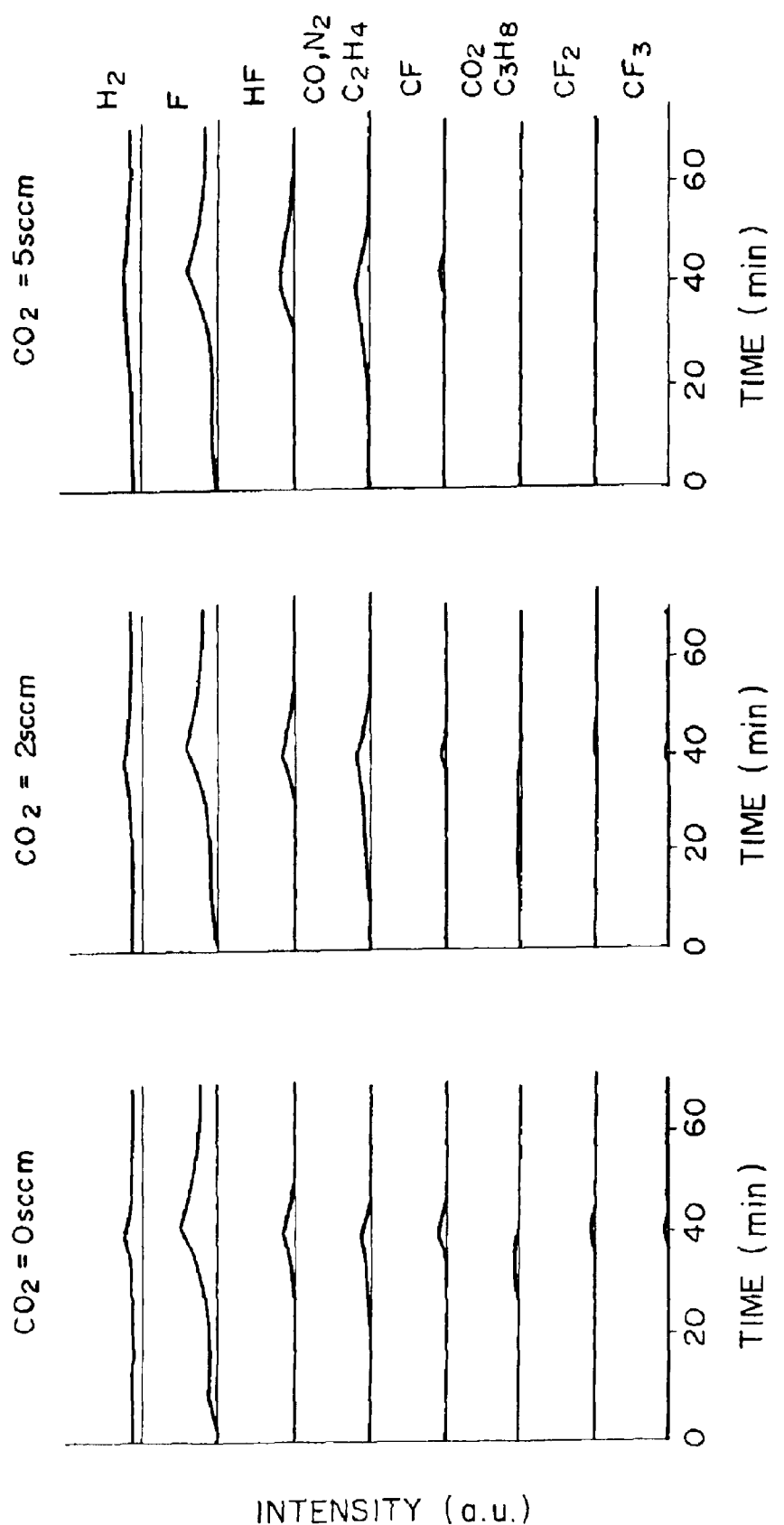
FIG. 24 is a diagram showing the intensity distributions in spectra of out gases when the flow rate (sccm) of $CO_2$ gas varies.
Figure 25:
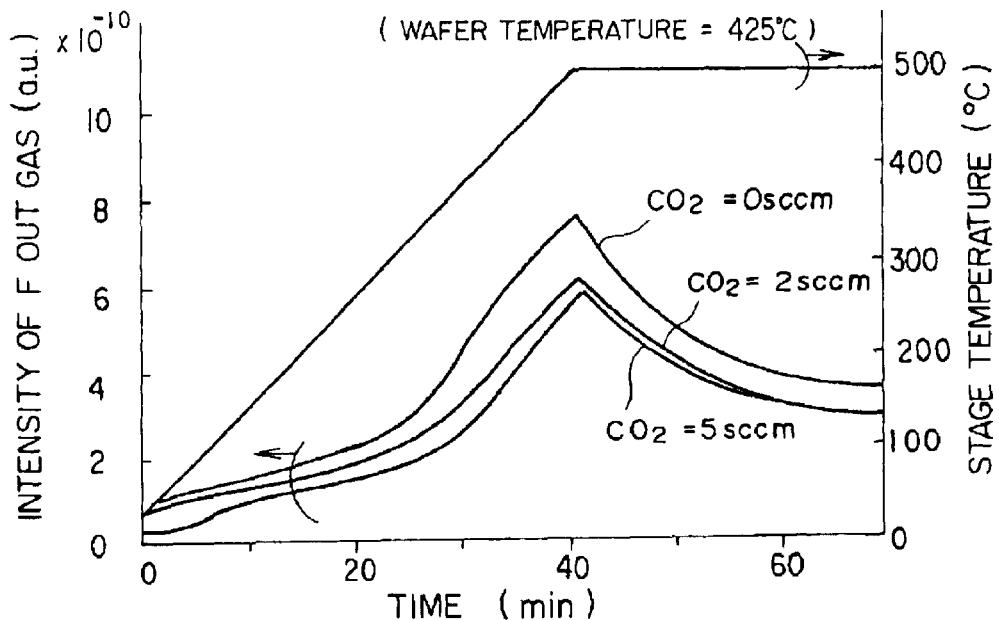
FIG. 25 is a diagram showing the intensity of an F out gas (a.u.) (TDS spectrum), which is shown on the left axis of ordinates, with respect to time (min) when the stage temperature (° C.) rises with respect to time (min) as shown on the right axis of ordinates in a case where the flow rate (sccm) of $CO_2$ gas varies.

Referring to FIGS. 23 through 25, the results of measurements of CF films deposited by using $CO_2$ gas as an oxygen containing gas at various flow rates (sccm) will be described in detail below. Using the plasma treatment system shown in FIG. 1, a CF film having a thickness of 2 μm was deposited on the wafer 10 by introducing Ar gas as a plasma producing gas at a flow rate of 30 sccm, and $C_4F_8$, $C_2H_4$ and $CO_2$ gases as thin-film deposition gases at flow rates of 40 sccm and 30 sccm and at a variable flow rate, respectively. The microwave power (the high-frequency power supply part 24) and the bias power (the high-frequency power supply part 42) were set to be 2700 W and 1500 W, respectively, and the temperature of the surface of the mounting table 4 was set to be 400° C.

FIG. 23 shows the variation (%) in weight of the CF film examined by means of the measuring device shown in FIG. 4 when the flow rate (sccm) of $CO_2$ gas varies. When the flow rates of $CO_2$ gas were 0 sccm, 2 sccm, 4.0 sccm and 5 sccm, the variations in weight were 2.5%, 1.2%, 1.0% and 0.8%, respectively. It can be understood that the variation (%) in weight decreases as the flow rate (sccm) of $CO_2$ gas increases.

FIG. 24 shows the intensity distributions of the TDS spectra of $H_2$, F, HF, CO, $N_2$, $C_2H_4$, CF, $CO_2$, $C_3H_8$, $CF_2$ and $CF_3$ when the flow rates of $CO_2$ gas are 0 sccm, 2 sccm and 5 sccm. This measurement was carried out by a mass spectrometer connected to a vacuum vessel, in which a predetermined amount of thin-film was put and the interior of which was heated to 425° C. In FIG. 24, the axis of ordinates denotes dimensionless amounts corresponding to the intensities of spectra, and the peaks thereof denote the amounts of desorbed gases. In addition, the axis of abscissas denotes time after the temperature rise in the vacuum vessel begins. The temperature rises at a rate of 10° C./min from room temperature. After the temperature reaches 425° C., it is held for 30 minutes. It can be seen from FIG. 24 that the amounts of desorbed CF, $CF_2$ and $CF_3$ decrease as the flow rate of $CO_2$ gas increases. It is guessed from these results that C—C bonds are difficult to be cut when the thin-film deposition gas includes an oxygen containing gas.

FIG. 25 shows the intensity of an F out gas (a.u.), which is shown on the left axis of ordinates, with respect to time (min) when the stage temperature (° C.) of a measuring stage, on which a predetermined amount of CF film is put, rises with respect to time (min) as shown on the right axis of ordinates in a case where the flow rates (sccm) of $CO_2$ gas are 0 sccm, 2.5 sccm and 5 sccm. When the stage temperature is 500° C., the temperature of the wafer is 425° C. It can be seen from FIG. 25 that the intensity of the F out gas decreases as the flow rate of $CO_2$ gas increases.

It can be understood from FIGS. 23 through 25 that if $CO_2$ gas is adopted as an oxygen containing gas, the variation in weight of the deposited CF film decreases by adding $CO_2$ gas, so that the amounts of desorbed F containing gases decrease to enhance thermostability.

Figure 26:
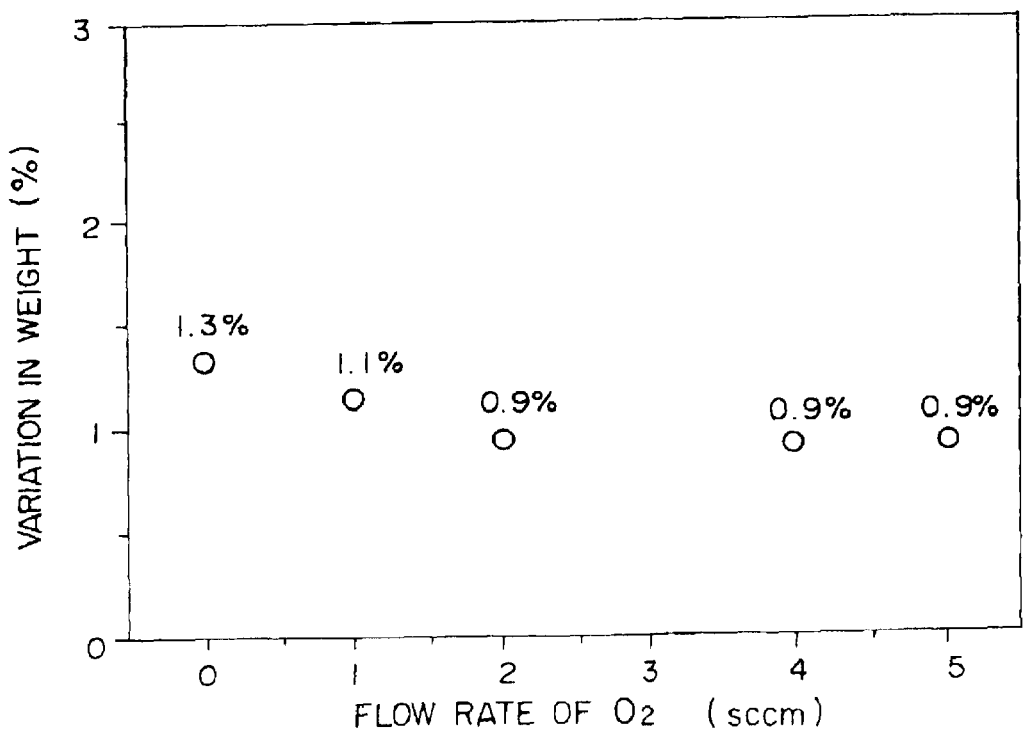
FIG. 26 is a diagram showing the variation (%) in weight of a CF film when the flow rate (sccm) of $O_2$ gas varies.
Figure 27:
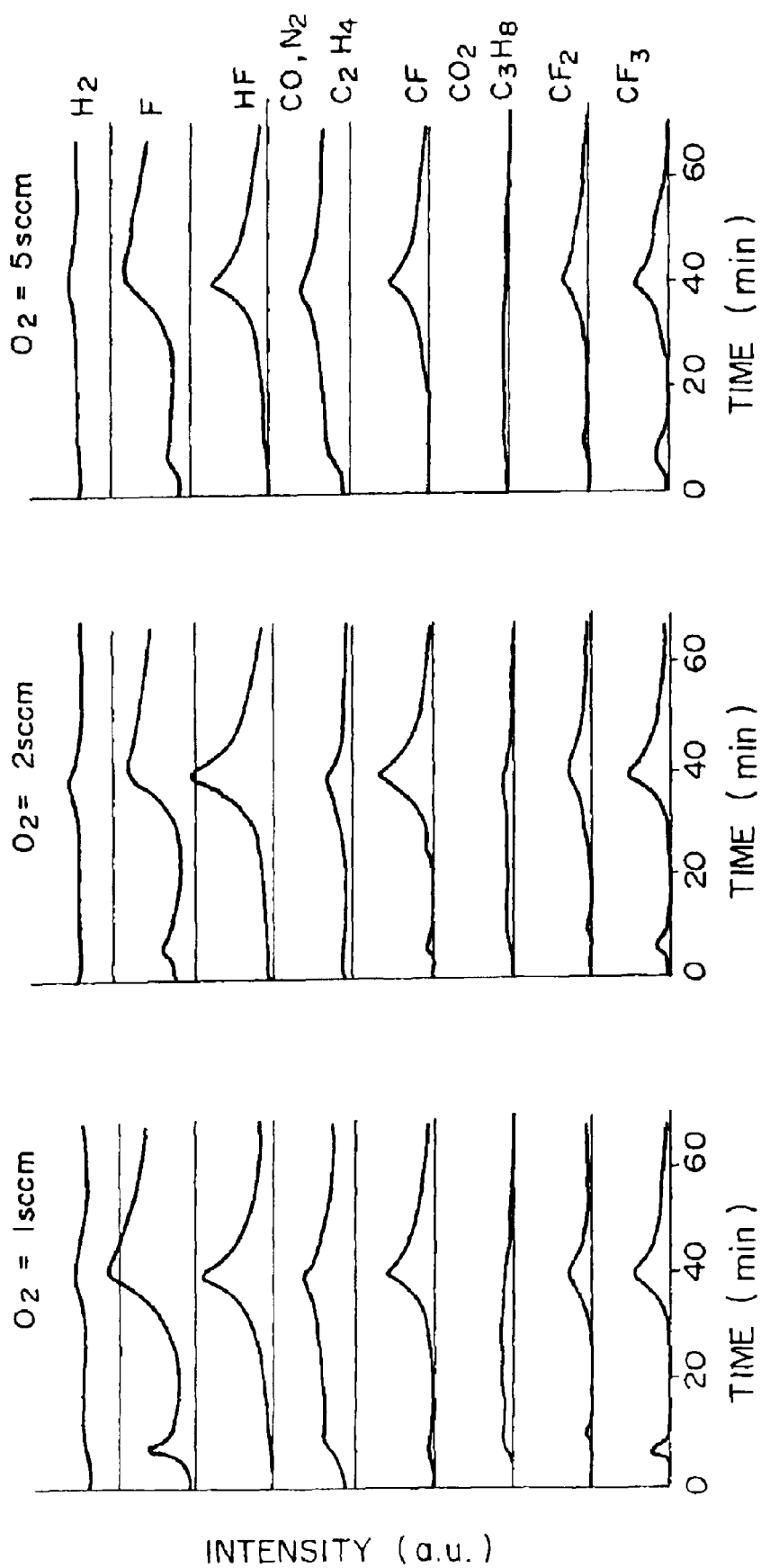
FIG. 27 is a diagram showing the intensity distributions in spectra of out gases when the flow rate (sccm) of $O_2$ gas varies.
Figure 28:
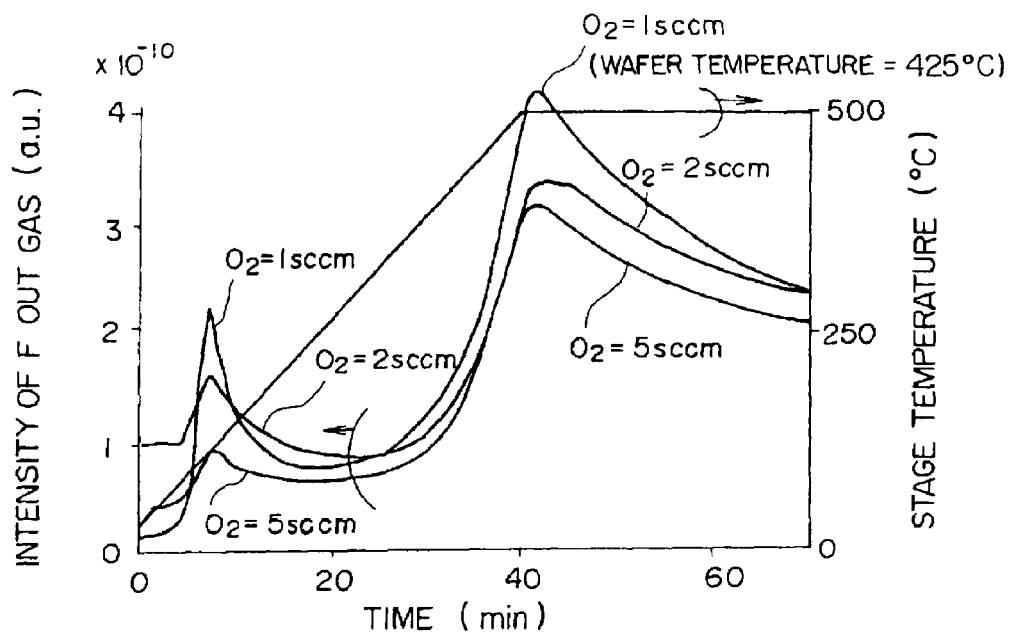
FIG. 28 is a diagram showing the intensity of an F out gas (a.u.) (TDS spectrum), which is shown on the left axis of ordinates, with respect to time (min) when the stage temperature (° C.) rises with respect to time (min) as shown on the right axis of ordinates in a case where the flow rate (sccm) of $O_2$ gas varies.

Referring to FIGS. 26 through 28, the results of measurements of CF films deposited by using $O_2$ gas as an oxygen containing gas at various flow rates (sccm) will be described in detail below. Using the plasma treatment system shown in FIG. 1, a CF film having a thickness of 2 μm was deposited on the wafer 10 by introducing Ar gas as a plasma producing gas at a flow rate of 30 sccm, and $C_4F_8$, $C_2H_4$ and $O_2$ gases as thin-film deposition gases at flow rates of 70 sccm and 30 sccm and at a variable flow rate, respectively. The microwave power (the high-frequency power supply part 24) and the bias power (the high-frequency power supply part 42) were set to be 2700 W and 1500 W, respectively, and the temperature of the surface of the mounting table 4 was set to be 430° C.

FIG. 26 shows the variation (%) in weight of the CF film examined by means of the measuring device shown in FIG. 4 when the flow rate (sccm) of $O_2$ gas varies. When the flow rates of $O_2$ gas were 0 sccm, 1 sccm, 2 sccm, 4 sccm and 5 sccm, the variations in weight were 1.3%, 1.1%, 0.9%, 0.9% and 0.9%, respectively. It can be understood that the variation (%) in weight decreases as the flow rate (sccm) of $O_2$ gas increases.

FIG. 27 shows the intensity distributions of the TDS spectra of $H_2$, F, HF, CO, $N_2$, $C_2H_4$, CF, $CO_2$, $C_3H_8$, $CF_2$ and $CF_3$ when the flow rates of $O_2$ gas are 1 sccm, 2 sccm and 5 sccm. This measurement was carried out by a mass spectrometer connected to a vacuum vessel, in which a predetermined amount of thin-film was put and the interior of which was heated to 425° C. In FIG. 27, the axis of ordinates denotes dimensionless amounts corresponding to the intensities of spectra, and the peaks thereof denote the amounts of desorbed gases. In addition, the axis of abscissas denotes time after the temperature rise in the vacuum vessel begins. The temperature rises at a rate of 10° C./min from room temperature. After the temperature reaches 425° C., it is held for 30 minutes. It can be seen from FIG. 27 that the amounts of desorbed CF, $CF_2$ and $CF_3$ decrease as the flow rate of $O_2$ gas increases. It is guessed from these results that C—C bonds are difficult to be cut when the thin-film deposition gas includes an oxygen containing gas.

FIG. 28 shows the intensity of an F out gas (a.u.), which is shown on the left axis of ordinates, with respect to time (min) when the stage temperature (° C.) of a measuring stage, on which a predetermined amount of CF film is put, rises with respect to time (min) as shown on the right axis of ordinates in a case where the flow rates (sccm) of $O_2$ gas are 1 sccm, 2 sccm and 5 sccm. When the stage temperature is 500° C., the temperature of the wafer is 425° C. It can be seen from FIG. 28 that the intensity of the F out gas decreases as the flow rate of $O_2$ gas increases.

It can be understood from FIGS. 26 through 28 that if $O_2$ gas is adopted as an oxygen containing gas, the variation in weight of the deposited CF film decreases by adding $O_2$ gas, so that the amounts of desorbed F containing gases decrease to enhance thermostability.

Figure 29:
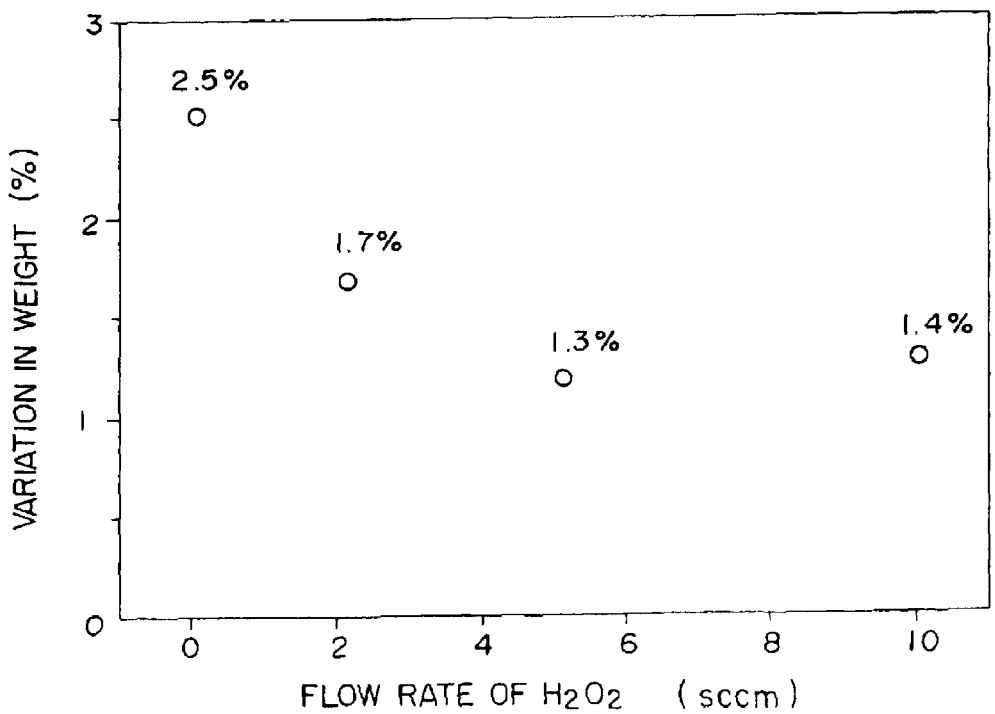
FIG. 29 is a diagram showing the variation (%) in weight of a CF film when the flow rate (sccm) of $H_2O_2$ gas varies.
Figure 30:
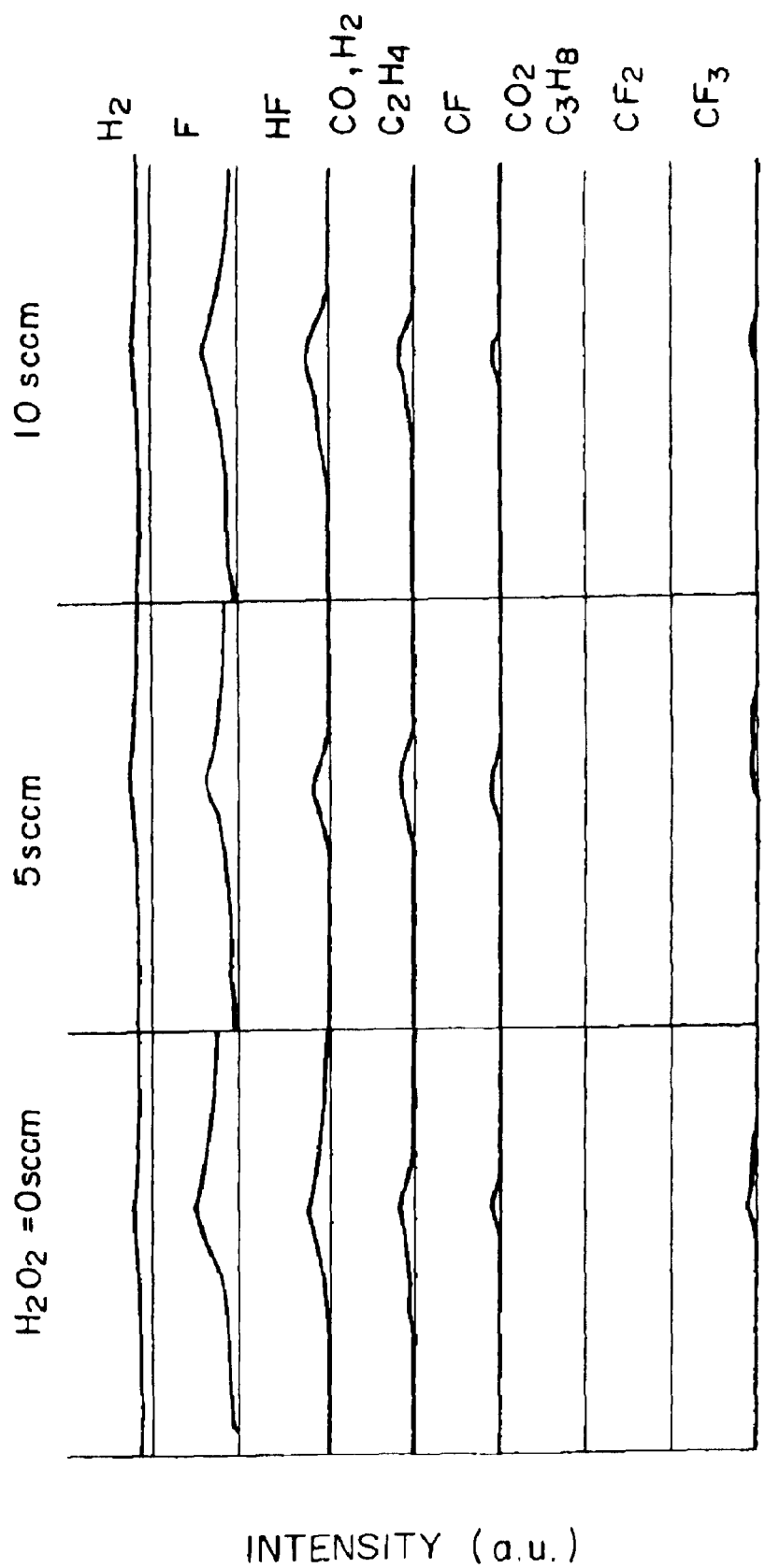
FIG. 30 is a diagram showing the intensity distributions in spectra of out gases when the flow rate (sccm) of $H_2O_2$ gas varies.

Referring to FIGS. 29 through 31, the results of measurements of CF films deposited by using $H_2O_2$ gas as an oxygen containing gas at various flow rates (sccm) will be described in detail below. Using the plasma treatment system shown in FIG. 1, a CF film having a thickness of 2 μm was deposited on the wafer 10 by introducing Ar gas as a plasma producing gas at a flow rate of 150 sccm, and $C_4F_8$, $C_2H_4$ and $H_2O_2$ gases as thin-film deposition gases at flow rates of 40 sccm and 30 sccm and at a variable flow rate, respectively. The microwave power (the high-frequency power supply part 24) and the bias power (the high-frequency power supply part 42) were set to be 2700 W and 1500 W, respectively, and the temperature of the surface of the mounting table 4 was set to be 400° C.

FIG. 29 shows the variation (%) in weight of the CF film examined by means of the measuring device shown in FIG. 4 when the flow rate (sccm) of $H_2O_2$ gas varies. When the flow rates of $H_2O_2$ gas were 0 sccm, 2 sccm, 5 sccm and 10 sccm, the variations in weight were 2.5%, 1.7%, 1.3% and 1.4%, respectively. It can be understood that the variation (%) in weight tends to decrease as the flow rate (sccm) of $H_2O_2$ gas increases.

FIG. 30 shows the intensity distributions of the TDS spectra of $H_2$, F, HF, CO, $N_2$, $C_2H_4$, CF, $CO_2$, $C_3H_8$, $CF_2$ and $CF_3$ when the flow rates of $H_2O_2$ gas are 0 sccm, 5 sccm and 10 sccm. This measurement was carried out by a mass spectrometer connected to a vacuum vessel, in which a predetermined amount of thin-film was put and the interior of which was heated to 425° C. In FIG. 30, the axis of ordinates denotes dimensionless amounts corresponding to the intensities of spectra, and the peaks thereof denote the amounts of desorbed gases. In addition, the axis of abscissas denotes time after the temperature rise in the vacuum vessel begins. The temperature rises at a rate of 10° C./min from room temperature. After the temperature reaches 425° C., it is held for 30 minutes. It can be seen from FIG. 30 that the amounts of desorbed CF, $CF_2$ and $CF_3$ decrease as the flow rate of $H_2O_2$ gas increases It is guessed from these results that C—C bonds are difficult to be cut when the thin-film deposition gas includes an oxygen containing gas.

FIG. 31 shows the intensity of an F out gas (a.u.), which is shown on the left axis of ordinates, with respect to time (min) when the stage temperature (° C.) of a measuring stage, on which a predetermined amount of CF film is put, rises with respect to time (min) as shown on the right axis of ordinates in a case where the flow rates (sccm) of $H_2O_2$ gas are 0 sccm, 5 sccm and 10 sccm. When the stage temperature is 500° C., the temperature of the wafer is 425° C. It can be seen from FIG. 31 that the intensity of the F out gas decreases as the flow rate of $H_2O_2$ gas increases.

It can be understood from FIGS. 29 through 31 that if $H_2O_2$ gas is adopted as an oxygen containing gas, the variation in weight of the deposited CF film decreases by adding $H_2O_2$ gas, so that the amounts of desorbed F containing gases decrease to enhance thermostability.

Figure 33:
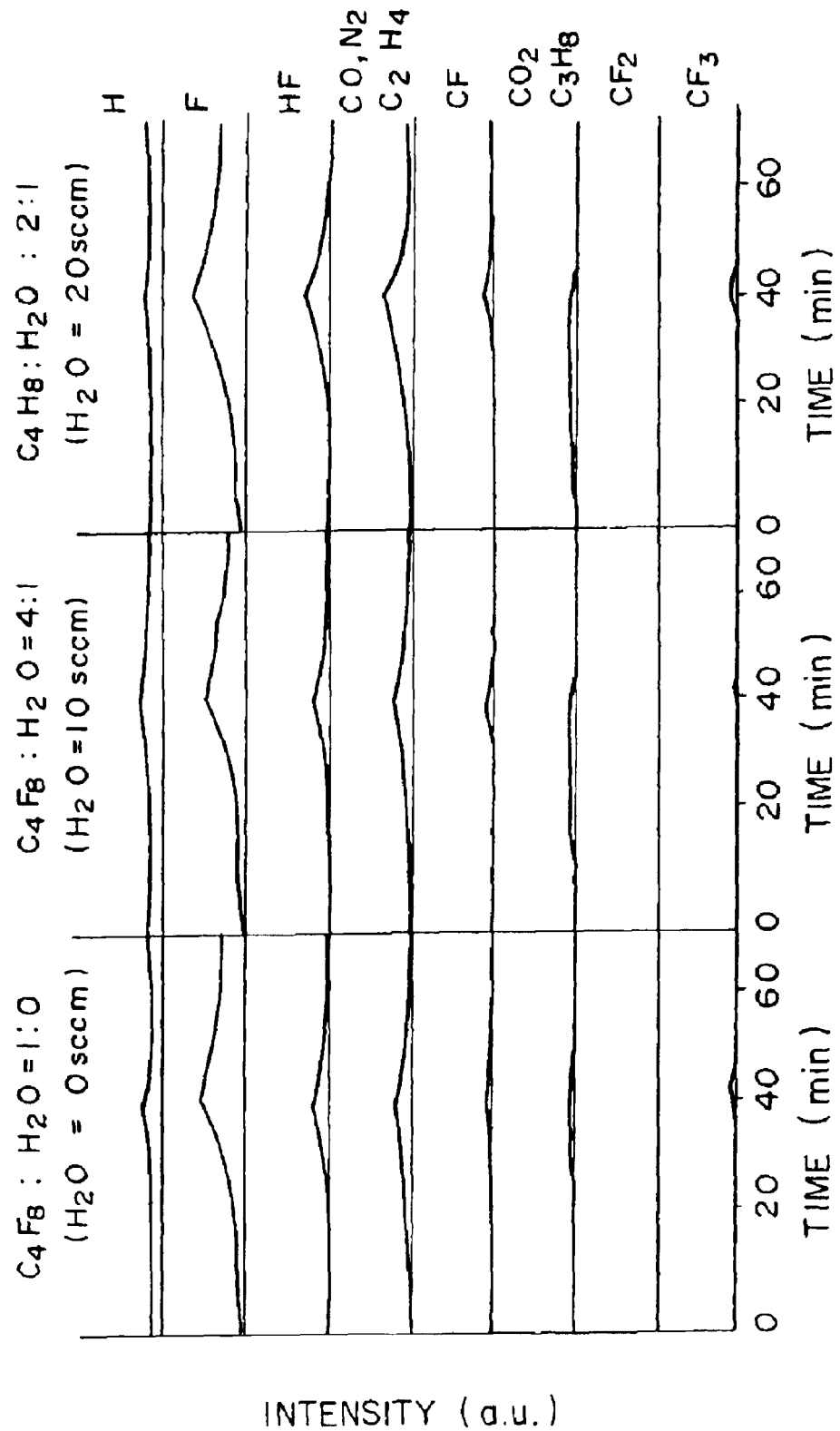
FIG. 33 is a diagram showing the intensity distributions in spectra of out gases when the flow rate (sccm) of $H_2O$ gas varies.

Referring to FIGS. 32 through 34, the results of measurements of CF films deposited by using $H_2O$ gas as an oxygen containing gas at various flow rates (sccm) will be described in detail below. Using the plasma treatment system shown in FIG. 1, a CF film having a thickness of 2 μm was deposited on the wafer 10 by introducing Ar gas as a plasma producing gas at a flow rate of 150 sccm, and $C_4F_8$, $C_2H_4$ and $H_2O$ gases as thin-film deposition gases at flow rates of 40 sccm and 30 sccm and at a variable flow rate, respectively. The microwave power (the high-frequency power supply part 24) and the bias power (the high-frequency power supply part 42) were set to be 2700 W and 1500 W, respectively, and the temperature of the surface of the mounting table 4 was set to be 400° C.

FIG. 32 shows the variation (%) in weight of the CF film examined by means of the measuring device shown in FIG. 4 when the flow rate (sccm) of $H_2O$ gas vanes. When the flow rates of $H_2O$ gas were 0 sccm, 5 sccm, 10 sccm, 15 sccm, 17 sccm and 20 sccm, the variations in weight were 2.4%, 1.7%, 1.6%, 2.0%, 2.3% and 2.9%, respectively. It can be understood that the variation (%) in weight is minimum when the flow rate (sccm) of $H_2O$ gas is 10 sccm.

FIG. 33 shows the intensity distributions of the TDS spectra of $H_2$, F, HF, CO, $N_2$, $C_2H_4$, CF, $CO_2$, $C_3H_8$, $CF_2$ and $CF_3$ when the flow ratios of $C_4F_8$ gas and $H_2O$ gas are 1:0 (flow rate of $H_2O$ gas: 0 sccm ), 4:1 (flow rate of $H_2O$ gas: 10 sccm) and 2:1 (flow rate of $H_2O$ gas: 20 sccm). This measurement was carried out by a mass spectrometer connected to a vacuum vessel, in which a predetermined amount of thin-film was put and the interior of which was heated to 425° C. In FIG. 33, the axis of ordinates denotes dimensionless amounts corresponding to the intensities of spectra, and the peaks thereof denote the amounts of desorbed gases. In addition, the axis of abscissas denotes time after the temperature rise in the vacuum vessel begins. The temperature rises at a rate of 10° C./min from room temperature. After the temperature reaches 425° C., it is held for 30 minutes. It can be seen from FIG. 33 that the amounts of desorbed CF, $CF_2$ and $CF_3$ are small when the flow rate of $H_2O$ gas is 10 sccm. It is guessed from these results that C—C bonds are difficult to be cut when the thin-film deposition gas includes an adequate amount of $H_2O$ gas.

FIG. 34 shows the intensity of an F out gas (a.u.), which is shown on the left axis of ordinates, with respect to time (min) when the stage temperature (° C.) of a measuring stage, on which a predetermined CF film is put, rises with respect to time (min) as shown on the right axis of ordinates in a case where the flow ratios of $C_4F_8$ gas and $H_2O$ gas are 1:0 (flow rate of $H_2O$ gas: 0 sccm), 4:1 (flow rate of $H_2O$: 10 sccm) and 2:1 (flow rate of $H_2O$ gas: 20 sccm). When the stage temperature is 500° C., the temperature of the wafer is 425° C. It can be seen from FIG. 34 that the intensity of the F out gas is low when the flow rate of $H_2O$ gas is 10 sccm.

It can be understood from FIGS. 32 through 34 that if $H_2O$ gas is adopted as an oxygen containing gas, the variation in weight of the deposited CF film decreases by adding $H_2O$ gas, so that the amounts of desorbed F containing gases decrease to enhance thermostability.

According to the present invention, it is required to use an oxygen containing gas, such as carbon monoxide (CO) gas, carbon dioxide ($CO_2$) gas, oxygen gas ($O_2$), water ($H_2O$) gas and hydrogen peroxide ($H_2O_2$), as a thin-film deposition gas. The CF containing gas added to the oxygen containing gas may be $CF_4$ gas, $C_2F_6$ gas, $C_3F_8$ gas or the like. Alternatively, the CF containing gas may be a gas containing C, F and H, e.g., $CHF_3$ gas. The hydrocarbon gas may be $CH_4$ gas, $C_2H_2$ gas, $C_2H_6$ gas, $C_3H_8$ gas, $C_4H_8$ gas or the like. Alternatively, hydrogen gas may be used in place of hydrocarbon gas.

Moreover, the present invention should not be limited to the production of a plasma using the ECR, but the invention may be applied to the production of a plasma using, e.g., a method called ICP (Inductive Coupled Plasma) for applying electric and magnetic fields to a process gas from a coil wound onto a dome-shaped container, or a conventional plasma producing method, such as the parallel plate plasma producing method.

The second preferred embodiment of the present invention will be described below.

A method for depositing an interlayer dielectric film of a CF film on a wafer 10, which is a substrate to be treated, using the system shown in FIG. 1 will be described. First, a gate valve (not shown) provided in the side wall of the vacuum vessel 2 is open, and a wafer 10, on which an aluminum wiring has been formed, is introduced from a load-lock chamber (not shown) by means of a transport arm (not shown) to be mounted on the mounting table 4 to be electrostatically absorbed by means of the electrostatic chuck 41.

Subsequently, after the gate valve is dosed to seal the interior of the vacuum vessel 2, the internal atmosphere is exhausted by the exhaust pipes 28, and the interior of the vacuum vessel 2 is evacuated to a predetermined degree of vacuum. Then, Ar gas is introduced from the plasma gas nozzles 31 into the first vacuum chamber 21 at a predetermined flow rate, and a thin-film deposition gas is introduced from the thin-film deposition gas supply part 5 into the second vacuum chamber 22 at a predetermined flow rate.

This preferred embodiment is characterized by the thin-film deposition gases. The thin-film deposition gases include a compound gas of carbon (C) and F (which will be hereinafter referred to as a "CF containing gas"), e.g., $C_4F_8$ gas, a hydrocarbon gas, e.g., $C_2H_4$ gas, and a silicon containing gas, e.g., $SiH_4$ gas These gases are supplied into the vacuum vessel 2 from the gas supply pipes 51 through 53, respectively. Then, the interior of the vacuum vessel 2 is held at a predetermined process pressure, and a bias voltage of, e.g., 13.56 MHz and 1500 W, is applied to the mounting table 4 by means of the high-frequency power supply part 42. In addition, the surface temperature of the mounting table 4 is set to be about 400° C.

A high-frequency wave (a microwave) of 2.45 GHz from the high-frequency power supply part 24 passes through the waveguide 25 to reach the ceiling of the vacuum vessel 2, and passes through the transmission window 23 to be introduced into the first vacuum chamber 21. On the other hand, a magnetic field extending from the upper portion of the first vacuum chamber 21 to the lower portion of the second vacuum chamber 22 is formed in the vacuum vessel 2 by the main electromagnetic coil 26 and the auxiliary electromagnetic coil 27. Thus, the intensity of the magnetic field is, e.g., 875 gausses, in the vicinity of the lower portion of the first vacuum chamber 21. The interaction between the magnetic field and the microwave produces electron cyclotron resonance, by which Ar gas is activated as plasma and enriched.

The plasma flowing from the first vacuum chamber 21 into the second vacuum chamber 22 activates $C_4F_8$ gas, $C_2H_4$ gas and $SiH_4$ gas, which have been supplied thereto, to form active species to deposit a CF film on the wafer 10. Thereafter, when a device is actually produced, the CF film is etched with a predetermined pattern, and a film of, e.g., W, is embedded in a groove portion to form a W wiring.

The CF film thus deposited has strong bonds and high thermostability as can be seen from the results of experiments which will be described later. That is, the amounts of desorbed F containing gases are small even at a high temperature.

It is considered that the reason for this is as follows. That is, if $SiH_4$ gas is added to the mixture of the CF containing gas and the hydrogen gas as the thin-film deposition gas, the active species of C, H and Si react with each other to form Si—C bonds and Si—F bonds in addition to C—F bonds, C—C bonds and C—H bonds. The bonds produced by adding $SiH_4$ gas, such as Si—C bonds and Si—F bonds, are stronger bonds than C—F bonds for reasons which will be described later, and difficult to be cut even at a high temperature of, e.g., 400° C.~450° C.

Therefore, stronger bonds than C—F bonds exist in a part of the CF film, and even if a part of C—F bonds are cut by heat at a high temperature, F containing gases of cut F, CF and so forth can not pass through the strong bonds to be confined in the CF film, so that the desorption of the F containing gasses is inhibited.

The reason why Si—C bonds and Si—F bonds are stronger bonds than C—F bonds will be described below.

First, the adhesion and hardness of an SiC film having Si—C bonds were measured, so that it was found that both were higher than those of a CF film. Therefore, Si—C bonds are stronger bonds than C—F bonds.

The amounts of F containing gases degassed from an SiOF film having Si—F bonds were measured, so that it was found that the degassed amounts were smaller than those degassed from a CF film. The SiOF film has Si—O bonds, Si—F bonds and so forth. The fact that the F containing gases are degassed from the SiOF film means that Si—F bonds are cut, and the fact that the F containing gases are degassed from the CF film means that C—F bonds are cut as described above. Therefore, the fact that the amounts of F containing gasses degassed from the SiOF film are smaller than the amounts of F containing gasses degassed from the CF film means that Si—F bonds are more difficult to be cut by heat to be stronger bonds than C—F bonds.

If $SiH_4$ gas is added to the mixture of a CF containing gas and a hydrocarbon gas as a thin-film deposition gas, the bonds of a CF film are strengthen to enhance thermostability. However, if the number of Si—C bonds increases, the dielectric constant of the CF film increases. Therefore, in order to suppress the dielectric constant of the CF film to be 2.5 or less, the proportion of Si—C bonds is preferably a few percents or less. Therefore, the flow rate of the silicon containing gas to the CF containing gas and the hydrocarbon gas is set so that the percentage of Si—C bonds is a few percents or less. For example, in the aforementioned example, the flow rates of $C_4F_8$ gas, $C_2H_4$ gas and $SiH_4$ gas are set to be $C_4F_8/C_2H_4/SiH_4$=60 sccm/30 sccm/5 sccm.

Experiments, which were carried out in order to measure thermostability of thin-films, will be described below. Using the plasma treatment system shown in FIG. 1, a CF film was deposited using Ar gas as the plasma producing gas, and $C_4F_8$ gas, $C_2H_4$ gas and $SiH_4$ gas as the thin-film deposition gases. The flow rates of Ar gas, $C_4F_8$ gas, $C_2H_4$ gas and $SiH_4$ gas were set to be 150 sccm, 60 sccm, 30 sccm and 5 sccm, respectively. The microwave power (the high-frequency power supply part 24) and the bias power (the high-frequency power supply part 42) were set to be 2700 W and 1500 W, respectively, and the process pressure was set to be 0.3 Pa (Example 1). The TDS (Thermal Desorption Spectroscopy) spectrum of the deposited CF film was measured.

Similarly, a CF film was deposited when $SiH_4$ gas was not added as the thin-film deposition gas, and the TDS spectrum thereof was measured. In this case, the kinds and flow rates of the used gases were Ar gas (150 sccm) as the plasma producing gas, and $C_4F_8$ gas (60 sccm) and $C_2H_4$ gas (30 sccm) as the thin-film deposition gases Comparative Example 1

These results are shown in FIGS. 7 and 8. FIG. 7 shows a case where $SiH_4$ gas is added as the thin-film deposition gas (Example 1), and FIG. 8 shows a case where $SiH_4$ gas is not added (Comparative Example 1). These spectra show the amounts (degassed amounts) of gases emitted from the CF film when the CF film is heated. The temperature conditions during measuring the TDS spectrum are shown in FIG. 9.

Figure 9:
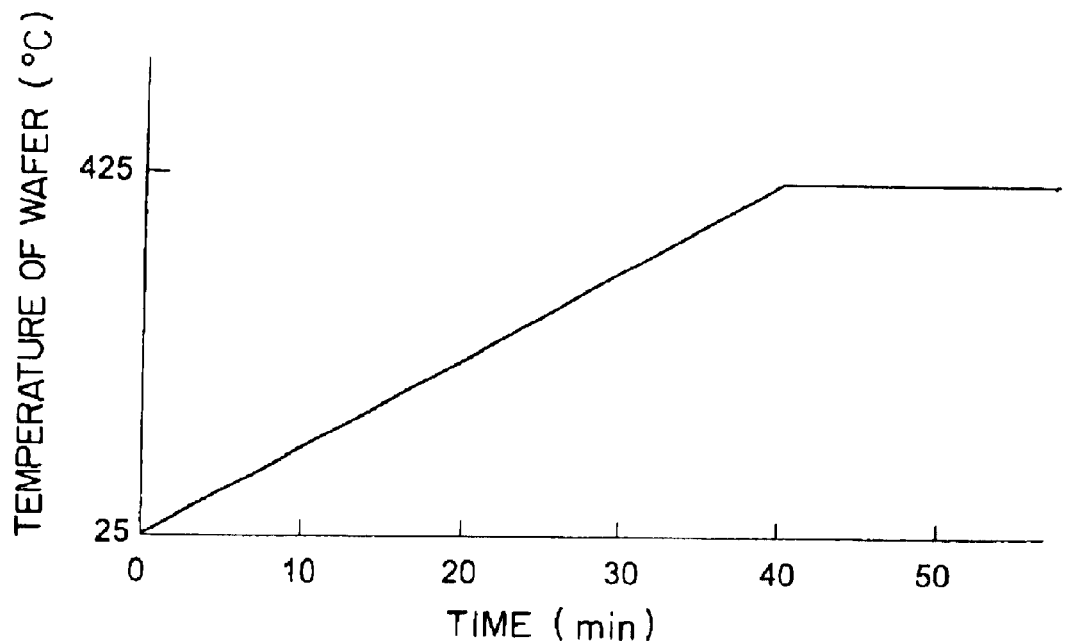
FIG. 9 is a characteristic diagram showing temperature conditions in the TDS spectrum.

It can be understood from FIGS. 7 through 9 that although degassing of F containing gases, such as F gas, CF gas, $CF_2$ and $CF_3$ gas, from all the CF films occurs at about 425° C. (40 minutes after the measurement begins), the degassed amounts of all the F containing gasses when $SiH_4$ gas is added are smaller than those when $SiH_4$ gas is not added, so that the thermostability of the CF film is enhanced by adding $SiH_4$ gas to the thin-film deposition gas. The dielectric constant of the CF film, to which $SiH_4$ gas has been added, was measured to be about 2.4, so that it was found that there is no problem in that the CF film is used as an interlayer dielectric film.

The kind of gas was changed to carry out experiments. That is, a CF film was deposited using Ar gas (150 sccm) as the plasma producing gas, and $C_4F_8$ gas (60 sccm), $C_2H_4$ gas (30 sccm) and $SiF_4$ gas (5 sccm) as the thin-film deposition gases, on other conditions which are the same as those in the above described Example 1 (Example 2). Then, the variation in weight of the CF film thus deposited was measured by the TGA (Thermal Gravimetry Analysis). This variation of weight is an index of the thermostability of the thin-film. As this value is small, the amounts of desorbed F containing gases are small, so that thermostability is high.

Similarly, a CF film was deposited without the addition of $SiF_4$, and the variation in weight thereof was measured by the TGA. In this case, the kinds and flow rates of the used gases were Ar gas (150 sccm) as the plasma producing gas, and $C_4F_8$ gas (60 sccm) and $C_2H_4$ gas (30 sccm) as the thin-film deposition gases (Comparative Example 2).

In addition, a CF film was deposited using Ar gas (150 sccm) as the plasma producing gas and $C_4F_8$ gas (60 sccm), $H_2$ gas (30 sccm) and $SiF_4$ gas (5 sccm) as the thin-film deposition gases, on other conditions which are the same as those in the above described Example 1 (Example 3), and a CF film was deposited using Ar gas (150 sccm) as the plasma producing gas and $C_4F_8$ gas (60 sccm) and $H_2$ gas (30 sccm) as the thin-film deposition gases, on other conditions which are the same as those in the above described Example 1 (Comparative Example 3). Then, the variations in weight of the CF films thus deposited were measured by the TGA.

As a result, in all Examples 2, 3 and Comparative Examples 2, 3, the temperature at the starting point was 423.9° C., and the temperature at the end point 2 hours after the experiment begins was 424.95° C. The variations in weight of the CF films were 1.05% in Example 2, 4.102% in Comparative Example 2, 0.98% in Example 3, and 4.0082% in Comparative Example 3. Thus, it can be seen that when $SiF_4$ and $SiH_4$ gases, which are silicon containing gases, are added, the variations in weight of the CF films are smaller than those when no silicon containing gases are added, so that the amounts of desorbed F containing gases decrease to enhance thermostability. In addition, it is confirmed that even if hydrogen gas is added as the thin-film deposition gas in place of the hydrocarbon gas as Example 3, thermostability is enhanced by adding the silicon containing gas The silicon containing gas added as the thin-film deposition gas should not be limited to $SiH_4$ gas, but it may be a compound gas of silicon and hydrogen, such as $Si_2H_6$ gas, a compound gas of silicon and fluorine, such as $SiF_4$ gas and $Si_2F_6$ gas, or a compound gas of silicon and hydrogen and fluorine, such as $SiH_2F_2$ gas. The CF containing gas may be $CF_4$, $C_2F_6$ or $C_3F_8$ gas. In place of the CF containing gas, a compound gas of C, F and H, such as $CHF_3$ gas, may be used. The hydrocarbon gas may be $CH_4$, $C_2H_2$, $C_2H_6$, $C_3H_8$, $C_4H_8$ or the like. In place of the hydrocarbon gas, hydrogen gas may be used. If the thin-film deposition gas includes C, F and H, the thin-film deposition gas may be a mixture of a compound gas of carbon and fluorine and a silicon containing gas.

Moreover, the present invention should not be limited to the production of a plasma using the ECR, but the invention may be applied to the production of a plasma using, e.g., a method called ICP (Inductive Coupled Plasma) for applying electric and magnetic fields to a process gas from a coil wound onto a dome-shaped container, or the conventional parallel plate plasma producing method.

The third preferred embodiment of the present invention will be described below.

A method for depositing an interlayer dielectric film of a CF film on a wafer 10, which is a substrate to be treated, using the system shown in FIG. 1 will be described. First, a gate valve (not shown) provided in the side wall of the vacuum vessel 2 is open, and the wafer 10, on which an aluminum wiring has been formed, is introduced from a load-lock chamber (not shown) by means of a transport arm (not shown) to be mounted on the mounting table 4 to be electrostatically absorbed by means of the electrostatic chuck 41. Subsequently, after the gate valve is closed to seal the interior of the vacuum vessel 2, the internal atmosphere is exhausted by the exhaust pipes 28, and the interior of the vacuum vessel 2 is evacuated to a predetermined degree of vacuum. Then, Ar gas is introduced from the plasma gas nozzles 31 into he first vacuum chamber 21 at a predetermined flow rate, and a thin-film deposition gas is introduced from the thin-film deposition gas supply part 5 into the second vacuum chamber 22 at a predetermined flow rate.

This preferred embodiment is characterized by the thin-film deposition gases. The thin-film deposition gases include $C_4F_8$ gas as a gas containing C and F, and acetylene gas ($C_2H_2$ gas) as a hydrocarbon gas. These gases are supplied into the vacuum vessel 2 from the gas supply pipes 51 and 52, respectively. Then, the interior of the vacuum vessel 2 is held at a predetermined process pressure, and a bias voltage of 13.56 MHz and 1500 W is applied to the mounting table 4 by means of the high-frequency power supply part 42.

On the other hand, a high-frequency wave (a microwave) of 2.45 GHz and 2000 W from the high-frequency power supply part 24 passes through the waveguide 25 to reach the ceiling of the vacuum vessel 2, and passes through the transmission window 23 to be introduced into the first vacuum chamber 21. In addition, a magnetic field extending from the upper portion of the first vacuum chamber 21 to the lower portion of the second vacuum chamber 22 is formed in the vacuum vessel 2 by the main electromagnetic coil 26 and the auxiliary electromagnetic coil 27. Thus, the intensity of the magnetic field is, e.g., 875 gausses, in the vicinity of the lower portion of the first vacuum chamber 21.

Thus, the interaction between the magnetic field and the microwave produces electron cyclotron resonance, by which Ar gas is activated as plasma and enriched. The plasma thus produced flows from the first vacuum chamber 21 into the second vacuum chamber 22 to activate $C_4F_8$ gas and $C_2H_4$ gas, which have been supplied thereto, (as plasma) to form active species (plasma) to deposit a CF film on the wafer 10. Thereafter, when a device is actually produced, the CF film is etched with a predetermined pattern, and a film of, e.g., W, is embedded in a groove portion to form a W wiring.

The CF film thus deposited has strong bonds and high thermostability. That is, the desorption of F containing gases is small even at a high temperature. Examples of experiments, which were carried out in order to examine the thermostability of CF films deposited by the above described method, will be described below. Using the plasma treatment system shown in FIG. 1, a CF film was deposited on a wafer 10 by introducing Ar gas at a flow rate of 30 sccm, $C_4F_8$ gas at a flow rate of 40 sccm and $C_2H_2$ gas at a flow rate of 30 sccm. Then, the CF film thus deposited was maintained at 425° C. in an atmosphere of $N_2$ gas for 2 hours to examine the variation in weight of the deposited CF film at a high temperature, e.g., 425° C., by means of an electronic force balance. This variation in weight is an index of the thermostability of the thin-film. As the variation in weight is small, the amounts of F containing gases are small, and thermostability is high. Furthermore, the microwave power and the bias power were se to be 2000 W and 1500 W, respectively.

As Comparative Example, $C_2H_4$ gas was introduced at a flow rate of 30 sccm as a hydrocarbon gas in place of $C_2H_2$ gas to deposit a CF film to measure the variation in weight thereof. The conditions for depositing the CF film were the same as those in the above described Example.

As a result, the variation in weight of the CF film was 2.68% when $C_2H_2$ gas was used, whereas it was 4.3% when $C_2H_4$ gas was used. Thus, it was confirmed that $C_4F_8$ gas was combined with $C_2H_2$ gas to decrease the variation in weight of the CF film to decrease the amounts of desorbed F containing gases to enhance thermostability.

Figure 10:
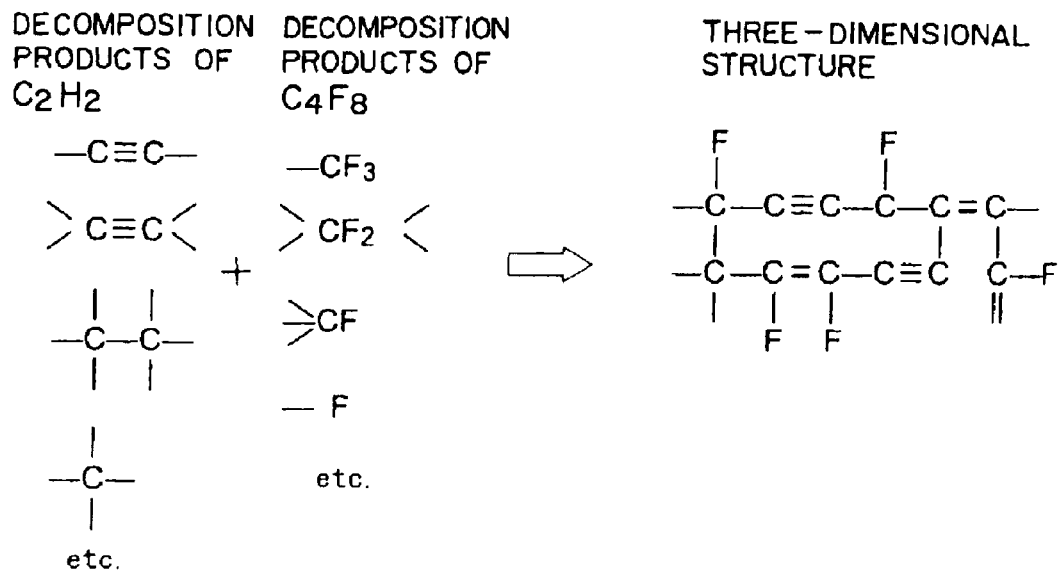
FIG. 10 is a schematic diagram for explaining the operation of the third preferred embodiment according to the present invention.

It is guessed that the reason for this is as follows. That is, $C_2H_2$ gas has a triple bond between carbons. If $C_2H_2$ is activated, decomposition products having triple bonds, double bonds and single bonds are produced as shown in FIG. 10. These decomposition products are bonded to decomposition products of $C_4F_8$ to produce a three-dimensional structure having triple bonds and double bonds. On the other hand, since $C_2H_4$ gas has a double bond, the decomposition products of $C_2H_4$ bonded to the decomposition products of $C_4F_8$ to produce a three-dimensional structure having double bonds. As the multiplicity of a bond increases from a single bond to a triple bond via a double bond, the bonding strength increases, and the bond is difficult to be cut by heat, so that degassing is difficult to occur from the CF film. Therefore, it is presumed that the CF film produced using $C_2H_2$ gas having a double bond and a triple bond has high thermostability. In addition, H separated from $C_2H_2$ gas is bonded to F, which is weakly bonded in the film, to produce HF gas to be desorbed from the CF film. Since F weakly bonded in the film is easily desorbed by heat, it is presumed that thermostability is also enhanced by removing such F.

Subsequently, in order to optimize the flow ratio of $C_4F_8$ gas and $C_2H_2$ gas, the inventors carried out the following experiments. Using the plasma treatment system shown in FIG. 1, a CF film was deposited on a wafer 10 by introducing Ar gas at a flow rate of 30 sccm, $C_4F_8$ gas at a flow rate of 40 sccm, and $C_2H_2$ gas at a flow rate of from 30 sccm to 70 sccm. Then, the variation in weight of the CF film thus deposited was examined by the above described method. At this time, the microwave power and the bias power were set to be 2000 W and 1500 W, respectively.

Figure 11:
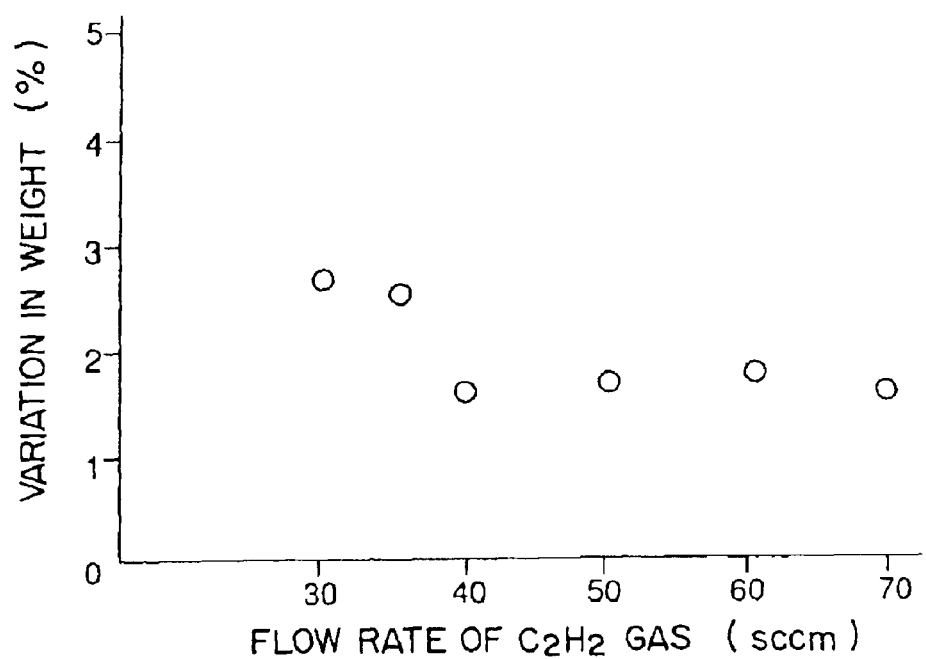
FIG. 11 is a characteristic diagram showing the variation in weight when the flow rate (sccm) of $C_2H_2$ gas varies.

The results are shown in FIG. 11. It was confirmed from these results that the variation in weight of the CF film was about 2.7% when the flow rate of $C_2H_2$ gas was 35 sccm or less, whereas the variation in weight decreased to about 1.7% when the flow rate of $C_2H_2$ gas was 40 sccm or more. However, if the flow rate of $C_2H_2$ gas exceeds 75 sccm, the peeling of the film occurs.

Thus, it was confirmed that the flow ratio of $C_4F_8$ gas and $C_2H_2$ gas had an optimum value, and the flow rate of $C_2H_2$ gas was preferably in the range of from 40 sccm to 70 sccm when the flow rate of $C_4F_8$ gas was 40 sccm. That is, it was confirmed that if 40 sccm/70 sccm $\leq C_4F_8$ gas/$C_2H_2$ gas $\leq$ 40 sccm/40 sccm (4/7 $\leq C_4F_8$ gas/$C_2H_2$ gas $\leq$ 1) was set, the variation in weight of the CF film was decreased to reduce the amounts of desorbed F containing gases to enhance thermostability.

It is considered that the reason for this is that when the flow ratio is $C_4F_8$ gas/$C_2H_2$ gas $\geq$ 1, the amount of $C_2H_2$ gas in the deposited thin-film decreases to difficult to form a three-dimensional structure, so that the proportion of strong C—F bonds in the CF film decreases.

Another example in this preferred embodiment will be described below. This example is characterzed in that $C_4F_8$ gas, $C_2H_2$ gas and $H_2$ gas are used as thin-film deposition gases. Also if such combined thin-film deposition gases are used, it is possible to enhance the thermostability of a CF film. These thin-film deposition gases are supplied by the thin-film deposition gas supply part 5 in the above described plasma treatment system.

In order to confirm advantages of this method, an example of experiment will be described below. Using the plasma treatment system shown in FIG. 1, a CF film was deposited on a wafer 10 by introducing Ar gas, $C_4F_8$ gas, $C_2H_2$ gas and $H_2$ gas at flow rates of 30 sccm, 40 sccm, 30 sccm and 25 sccm, respectively. The variation in weight of the CF film thus deposited was examined by the above described method. The microwave power and the bias power were set to be 2000 W and 1500 W, respectively.

As a result, the variation in weight of the CF film was 1.89%, which was less than the variation in weight (4.3%) when $C_4F_8$ gas was combined with $C_2H_4$ gas to deposit the CF film as the above described Comparative Example. Therefore, it was confirmed that if $C_4F_8$ gas, $C_2H_2$ gas and $H_2$ gas were combined, the variation in weight of the CF film reduced to decrease the amounts of desorbed F containing gases to enhance thermostability.

Then, the inventors tried to optimize the flow ratio of $C_4F_8$ gas, $C_2H_2$ gas and $H_2$ gas by the following method. First, in order to optimize the flow ratio of a mixed gas of $C_4F_8$ gas and $C_2H_2$ gas to $H_2$ gas, the following experiment was carried out.

Using the plasma treatment system shown in FIG. 1, CF films were deposited by introducing Ar gas at a flow rate of 30 sccm and $H_2$ gas at a flow rate of 10 sccm to 60 sccm, while setting the flow ratio of a mixed gas to $C_4F_8$ gas/$C_2H_2$ gas=4/6 and while setting the total flow rate of the mixed gas and $H_2$ gas to 100 sccm. Then, the variations in weight of the CF films thus deposited were examined by the above described method. The microwave power and the bias power were set to be 2000 W and 1500 W, respectively.

Figure 12:
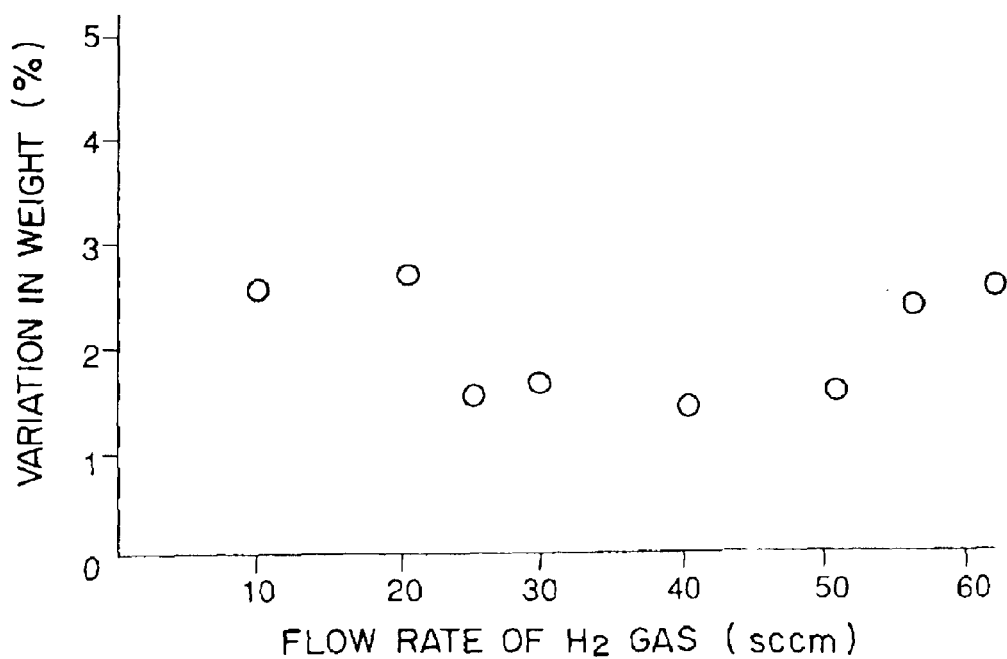
FIG. 12 is a characteristic diagram showing the variation in weight when the flow rate (sccm) of $H_2$ gas varies.

The results are shown in FIG. 12. It was confirmed from these results that the variation in weight of the CF film was about 2.8% when the flow rate of $H_2$ gas was 20 sccm or less, whereas the variation in weight was decreased to about 1.7% when the flow rate of $H_2$ gas was in the range of from 25 sccm to 50 sccm. Furthermore, when the flow rate of $H_2$ gas exceeds 55 sccm, the peeling of the film occurs.

Thus, it was confirmed that there is an optimum flow ratio (mixed gas/$H_2$ gas) of the mixed gas to $H_2$ gas, the lower limit of which is 50 sccm/50 sccm and the upper limit of which is 75 sccm/25 sccm, i.e., the optimum flow ratio is $1 \leq$ mixed gas/$H_2$ gas $\leq 3$.

Then, in order to optimize the mixing ratio of the mixed gas, the following experiments were carried out. Using the plasma treatment system shown in FIG. 1, CF films were deposited on a wafer 10 by introducing Ar gas at a flow rate of 30 sccm, $H_2$ gas at a flow rate of 30 sccm, and the mixed gas at a flow ratio of $0.6 \leq C_4F_8$ gas/$C_2H_2$ gas $\leq 1.6$. Then, the variations in weight of the CF films thus deposited were examined by the above described method. At this time, the microwave power and the bias power were set to be 2000 W and 1500 W, respectively.

Figure 13:
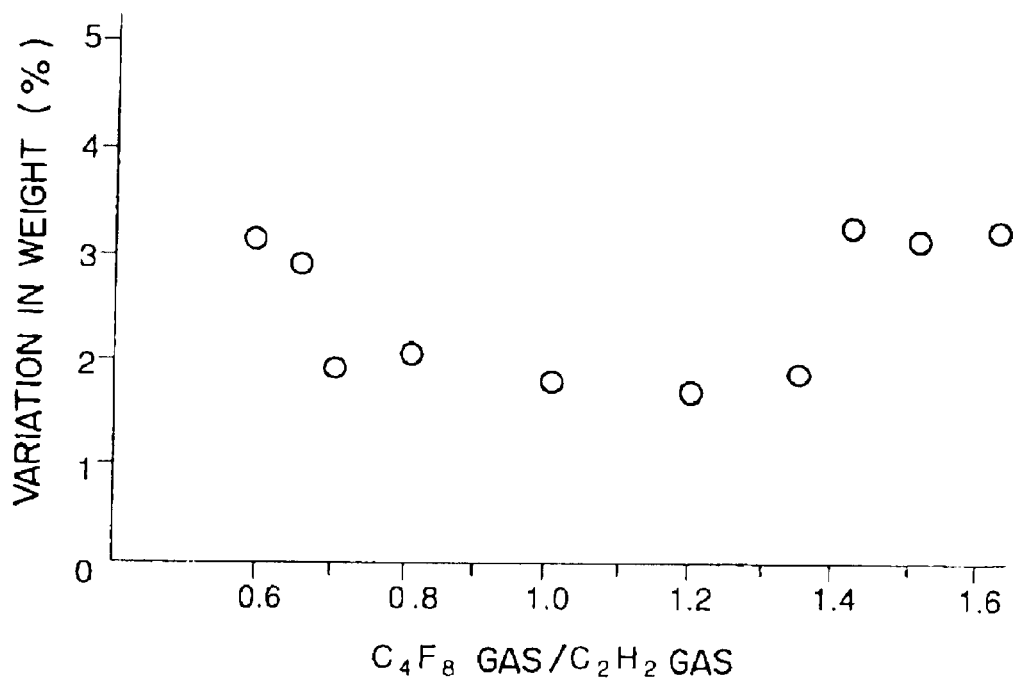
FIG. 13 is a characteristic diagram showing the relationship between the variation in weight and the flow ratio of $C_4F_8$ gas and $C_2H_2$ gas when the flow rate of $H_2$ gas is constant.

The results are shown in FIG. 13. It was confirmed from these results that the variations in weight of the CF films were 2.9% or more when the mining ratio of the mixed gas was 1.4 or higher, whereas the variations in weight were decreased to about 1.7%~2% when the mixing ratio was in the range of from 0.7 to 4/3. Furthermore, if the mixing ratio is less than 0.65, the peeling of the film occurs.

Thus, it was confirmed that there was the optimum mixing ratio of the mixed gas, which was $0.7 \leq C_4F_8$ gas/$C_2H_2$ gas $\leq 4/3$.

As can be seen from these results, if $C_4F_8$ gas, $C_2H_4$ gas and $H_2$ gas are used as thin-film deposition gases, the optimum flow ratios of these gases are $0.7 \leq C_4F_8$ gas/$C_2H_2$ gas $\leq 4/3$ and $1 \leq$ mixed gas/$H_2$ gas $\leq 3$. Thus, if such a flow ratio is set, the variation in weight of the CF film reduces to decrease the amounts of desorbed F containing gases to enhance thermostability.

In addition, it was confined that the optimum flow ratio was $4/7 \leq C_4F_8$ gas/$C_2H_2$ gas $\leq 1$ if $C_4F_8$ gas and $C_2H_2$ gas were used as thin-film deposition gases, whereas the upper limit of the optimum flow ratio was 4/3 if $H_2$ gas was added to these gases, so that the upper limit increased, i.e., the lower limit of the flow rate of $C_2H_2$ gas decreased.

It is guessed that the reason for this is as follows. If $H_2$ gas is mixed, H produced by activating $H_2$ gas as plasma is bonded to F, which is weakly bonded in the film, to produce HF gas to be desorbed from the CF film. Since F weakly bonded in the film is easily desorbed by heat, thermostability is enhanced by removing such F. Therefore, when $H_2$ is mixed, the lower limit of the flow rate of $C_2H_2$ decreases.

According to this preferred embodiment, the plasma producing method should not be limited to the ECR, but this preferred embodiment may be applied to the production of a plasma called an ICP (Inductive Coupled Plasma) by a method for applying electric and magnetic fields to a process gas from a coil wound onto a dome-shaped container. Moreover, this preferred embodiment may be applied to the production of a plasma called a helicon wave plasma by the interaction between a helicon wave of, e.g., 13.56 MHz, and a magnetic field applied to a magnetic coil, the production of a plasma called a magnetron plasma by applying a magnetic field to two parallel cathodes substantially in parallel, and the production of a plasma by applying a high-frequency power between electrodes called parallel plates facing each other.

The fourth preferred embodiment of the present invention will be described below.

A method for depositing an interlayer dielectric film of a CF film on a wafer 10, which is a substrate to be treated, using the system shown in FIG. 1 will be described. First, a gate valve (not shown) provided in the side wall of the vacuum vessel 2 is open, and a wafer 10, on which an aluminum wiring has been formed, is introduced from a load-lock chamber (not shown) by means of a transport arm (not shown) to be mounted on the mounting table 4 to be electrostatically absorbed by means of the electrostatic chuck 41.

Subsequently, after the gate valve is closed to seal the interior of the vacuum vessel 2, the internal atmosphere is exhausted by the exhaust pipes 28, and the interior of the vacuum vessel 2 is evacuated to a predetermined degree of vacuum. Then, Ne gas is introduced from the plasma gas nozzles 31 into the first vacuum chamber 21 at a predetermined flow rate, and a thin-film deposition gas is introduced from the thin-film deposition gas supply part 5 into the second vacuum chamber 22 at a predetermined flow rate. Then, the interior of the vacuum vessel 2 is held at a predetermined process pressure, and a bias voltage of 13.56 MHz and 1500 W is applied to the mounting table 4 by means of the high-frequency power supply part 42.

On the other hand, a high-frequency wave (a microwave) of 2.45 GHz and 2000 W from the high-frequency power supply part 24 passes through the waveguide 25 to reach the ceiling of the vacuum vessel 2, and passes through the transmission window 23 to be introduced into the first vacuum chamber 21. In addition, a magnetic field extending from the upper portion of the first vacuum chamber 21 to the lower portion of the second vacuum chamber 22 is formed in the vacuum vessel 2 by the main electromagnetic coil 26 and the auxiliary electromagnetic coil 27. Thus, the intensity of the magnetic field is, e.g., 875 gausses, in the vicinity of the lower portion of the first vacuum chamber 21.

Thus, the interaction between the magnetic field and the microwave produces electron cyclotron resonance, by which Ne gas is activated as plasma and enriched. The plasma thus produced flows from the first vacuum chamber 21 into the second vacuum chamber 22 to activate $C_4F_8$ gas and $C_2H_4$ gas, which have been supplied thereto, (as plasma) to form active species (plasma).

On the other hand, Ne gas is drawn into the wafer 10 by the bias voltage to shave off the corners of a pattern (a recessed portion) in the surface of the wafer 10 to increase the frontage thereof. Then, a CF film is formed by the plasma of the thin-film deposition in addition to the sputter etching function to be embedded in the recessed portion. Thus, an interlayer dielectric film of the CF film is deposited on the wafer 10. Thereafter, when a device is actually produced, the CF film is etched with a predetermined pattern, and a film of, e.g., W, is embedded in a groove portion to form a W wiring.

Figure 14:
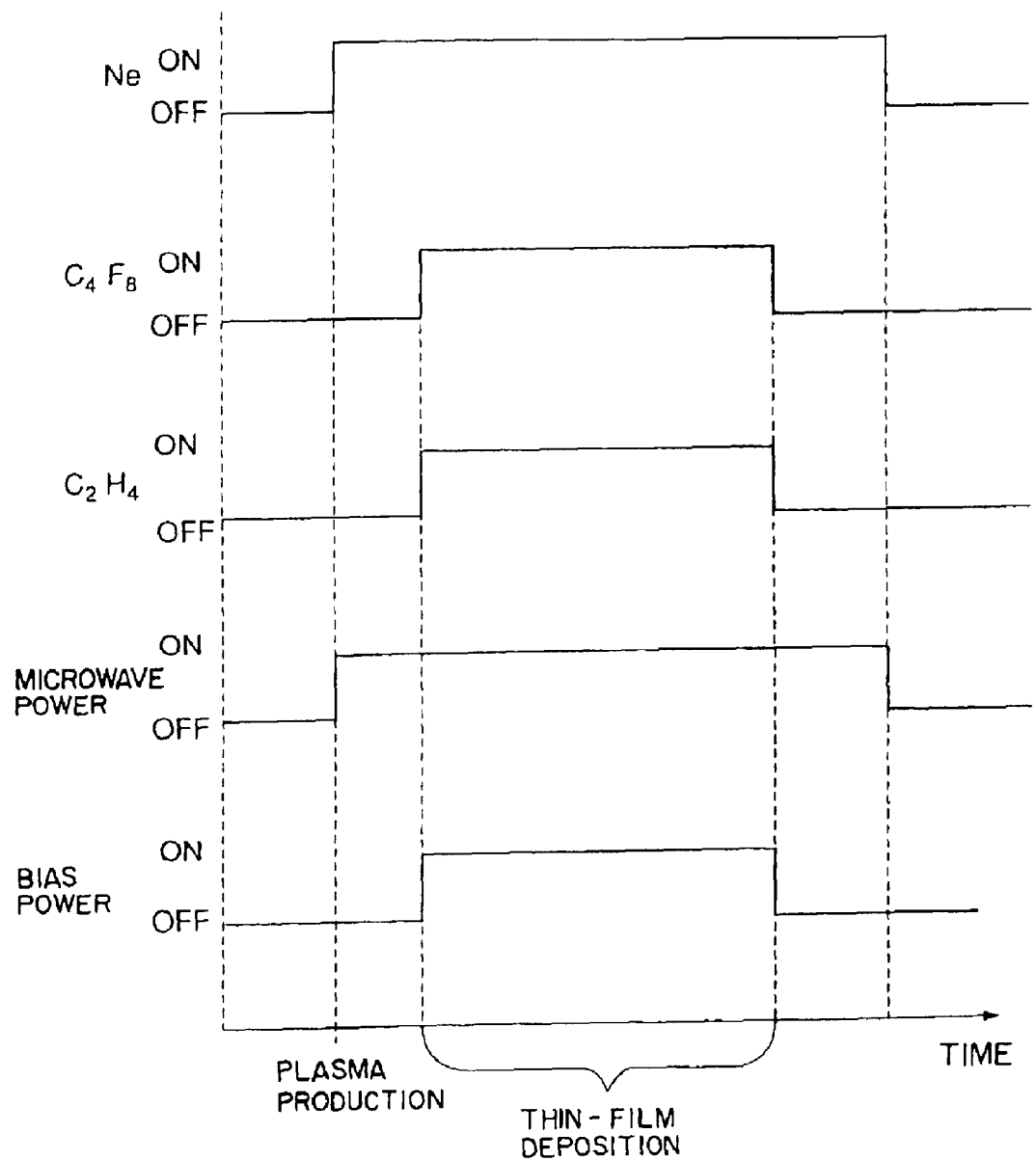
FIG. 14 is a sequence diagram in the fourth preferred embodiment of the present invention.

FIG. 14 shows a sequence of the above described process. In an actual process, the introduction of Ne gas and the application of the microwave power (the high-frequency power supply part 24) are substantially simultaneously carried out to produce a plasma. Subsequently, a predetermined time, e.g., 30 seconds, after the introduction of Ne gas, the application of the bias power (the high-frequency power supply part 42) and the introduction of $C_4F_8$ gas and $C_2H_4$ gas are substantially simultaneously carried out to start a thin-film deposition treatment. The reason why the introduction timing of Ne gas is shifted from the introduction timing of $C_4F_8$ gas and so forth is that it is required to stabilize the plasma and to heat the wafer.

Figure 15:
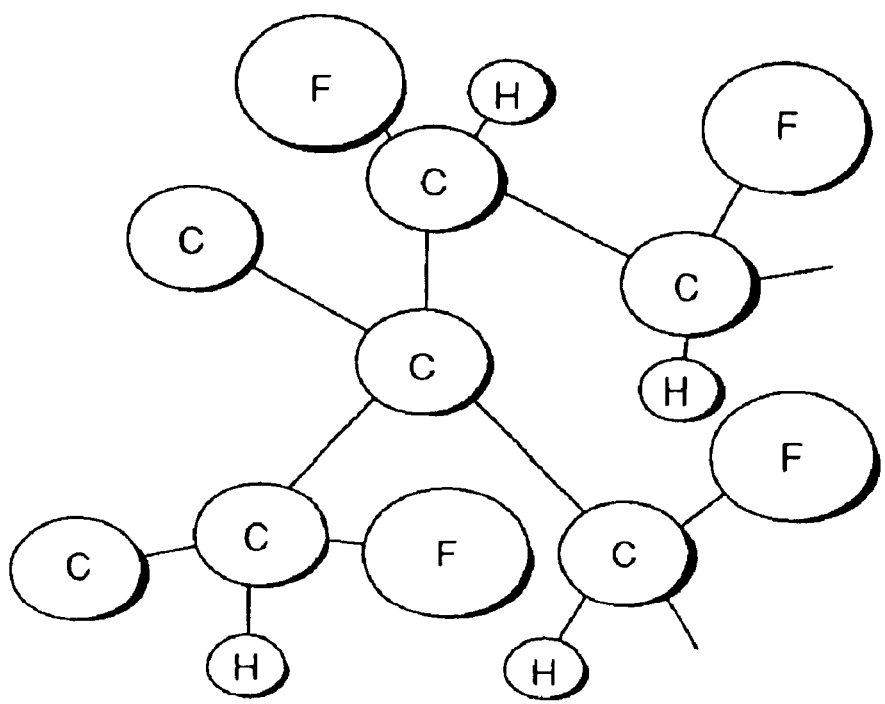
FIG. 15 is a schematic diagram for explaining bonds existing in a CF film.

The CF film thus deposited has strong bonds, and high thermostability as can be seen from the results of experiments which will be described later. That is, the amounts of desorbed F containing gases are small even at a high temperature. It is considered that the reason for this is that Ne gas is used as the plasma producing gas. That is, it is considered that if a CF film is deposited using the combination of a CF containing gas with a hydrocarbon gas as the thin-film deposition gas, C—C bonds, C—F bonds and C—H bonds exist in the deposited CF film as shown in FIG. 15, and these bonds are sputtered by the plasma producing gas during the thin-film deposition treatment since the plasma producing gas has the sputtering function as described above.

By the way, the sputtering effect is related to the magnitude of collision energy. Therefore, in general, if a gas of an atom having large mass is used as a sputter gas, the sputtering effect increases, and if a gas of an atom having small mass is used as a sputter gas, the sputtering effect decreases. Conventionally, Ar gas is used as a plasma producing gas since it is easy to produce a plasma. Comparing the mass of Ar with that of Ne, Ne is about half the mass of Ar (the atomic weight of Ar is 39.948 and the atomic weight of Ne is 20.179). Therefore, it is presumed that when Ar gas is used, the sputtering effect is greater than that when Ne gas is used.

If the CF film is sputtered, the above described C—C bonds and so forth are physically struck. If the sputtering effect is great, these bonds are struck. It is considered that if Ar gas is used, C—H bonds and C—F bonds, which are weak bonds, are not only cut, but a part of C—C bonds, which are strong bonds, are also cut, so that the amount of strong bonds in the whole film decreases.

On the other hand, it is considered that if Ne gas is used, C—C bonds, which are strong bonds, are not cut although C—F bonds and C—H bonds, which are weak bonds, are cut. Therefore, H and F produced by the cutting of the bonds are scattered to the outside of the CF film during the deposition of the CF film, and C, from which F and H have been cut, are bonded to another C to form a new C—C bond. Thus, C—C bonds form a three-dimensional structure, so that the bonds constituting the CE film are strengthen.

Therefore, since the sputtering function is carried out from the surface of the CF film thus formed, the number of weak bonds decreases in the whole CF film, and strong bonds also exist in the surface layer of the film. The desorption of F containing gases occurs if F, CF, $CF_2$ and so forth, which are produced by cutting C—C bonds and C—F bonds by heat during a heat treatment at a high temperature, are scattered as gases. If the weak bonds are previously struck during the thin-film deposition treatment, the number of bonds cut by heat decreases, so that the desorption of F containing gases can be suppressed.

In addition, if the surface layer of the film is strengthen, C—C bonds in this portion are difficult to be cut even at a high temperature. Therefore, even if weak bonds are cut below the surface layer to cause degassing, the strong film of the surface layer serves as a barrier to inhibit F containing gasses from passing therethrough. Thus, in the CF film formed using Ne gas as the plasma producing gas, the degassing of F containing gasses is inhibited even during a heat treatment at a high temperature, so that the thermostability of the CF film is improved. On the other hand, when Ar is used as the plasma producing gas, the proportion of weak bonds in the whole film is large, and the proportion of strong bonds existing in the surface layer of the film is small. Therefore, the amount of bonds, which are cut during a heat treatment at a high temperature, is large, and the degassed amount of F containing gases is large. In addition, it is difficult to confine degassing, so that the degassed amount increases.

Then, examples of experiments, which were carried out in order to examine the thermostability of a CF film formed by the method of the present invention, will be described below. Using the plasma treatment system shown in FIG. 1, a CF film having a thickness of 2 $\mu$m was deposited on a wafer 10 by introducing Ne gas as a plasma producing gas at a flow rate of 150 sccm, and $C_4F_8$ gas and $C_2H_4$ gas as thin-film deposition gases at flow rates of 40 sccm and 30 sccm, respectively. In this case, the thin-film deposition gases were introduced 30 minutes after the introduction of Ne gas. In addition, the microwave power and the bias power were set to be 2700 W and 1500 W, respectively. Moreover, the temperature of the surface of the mounting table 4 was set to be 300° C., and the process pressure was set to be 0.2 Pa (Example 1).

The CF film thus deposited was annealed at 425° C. for 2 hours, and the variation in weight of the CF film before and after annealing was examined by an electron force balance. This variation in weight is an index of the thermostability of a thin-film. As this value is small, the amounts of desorbed F containing gases are small, and thermostability is high.

In addition, experiments were carried out when Ne gas was introduced as the plasma producing gas at a flow rate of 150 sccm, $C_4F_8$ gas and hydrogen ($H_2$) gas were introduced as the thin-film deposition gases at flow rates of 40 sccm and 50 sccm, respectively, and all other conditions were the same as those in Example 1 (Example 2), when Ar gas was used as the plasma producing gas (Comparative Example 1), when Kr gas was used as the plasma producing gas (Comparative Example 2), and when Xe gas was used as the plasma producing gas (Comparative Example 3). In Comparative Examples 1, 2 and 3, all of the flow rates of Ar gas and so forth and other conditions were the same as those in Example 1.

Figure 16:
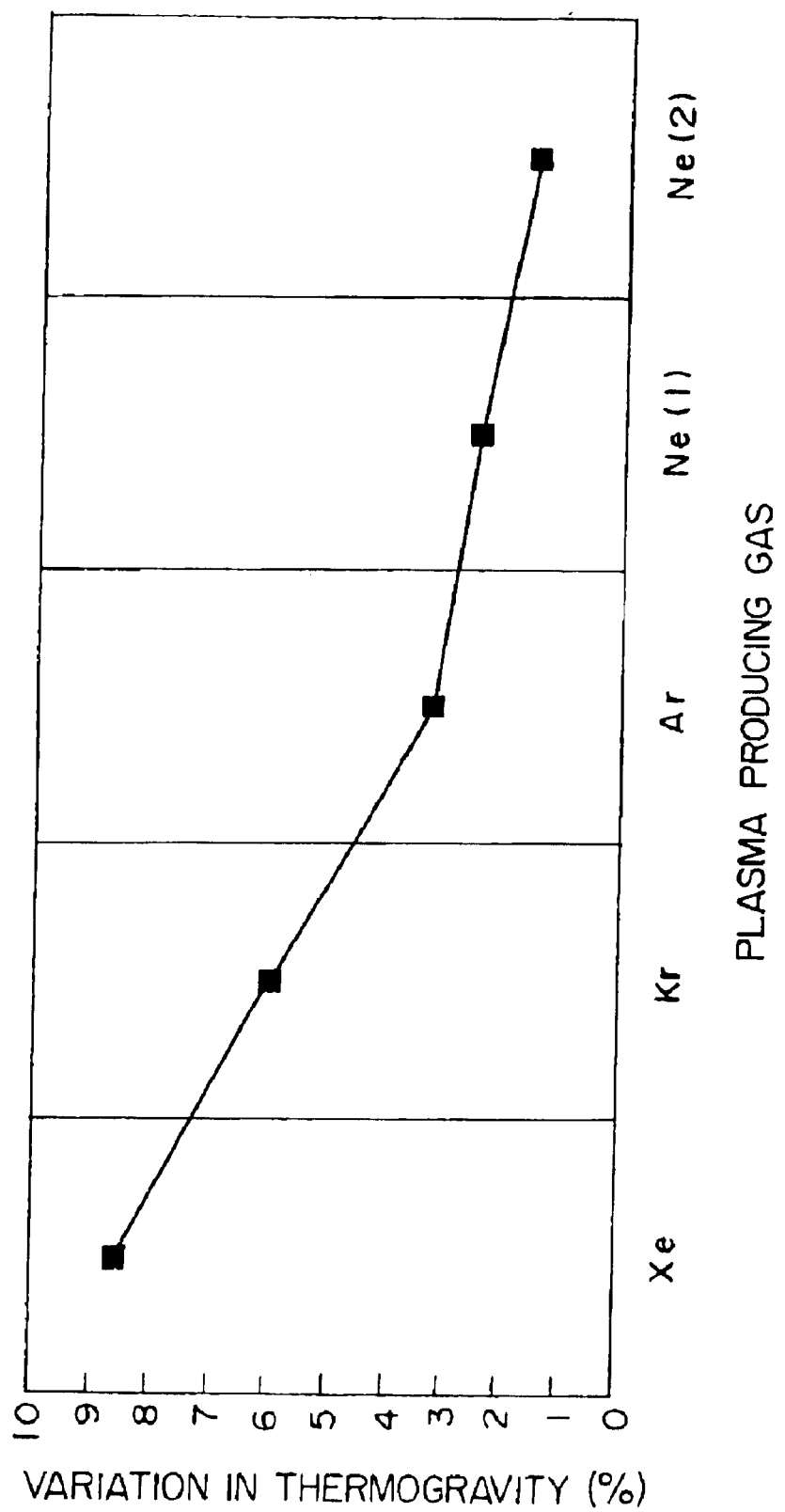
FIG. 16 is a characteristic diagram the relationship between plasma producing gases and the variation in thermogravity of a CF film.

The results are shown in FIG. 16, in which Ne(1) and Ne(2) show Examples 1 and 2, respectively. It was confirmed from these results that the variations in weight of the CF film were about 2.6% when Ne gas was used as the plasma producing gas (Example 1), about 3.5% when Ar was used as the plasma producing gas (Comparative Example 1), about 6% when Kr gas was used as the plasma producing gas (Comparative Example 2), and about 8.7% when Xe gas was used as the plasma producing gas (Comparative Example 3). The atomic weights of Xe and Kr are 131.29 and 83.80, respectively, which are far greater than those of Ar and Ne. Therefore, it can be seen that the mass of the plasma producing gas is in proportion to the variation in thermogravity of the CF film, and as the mass of the plasma producing gas decreases, the variation in weight of the CF film decreases, so that thermostability is enhanced.

When the CF film was deposited by the process in Example 2, the variation in thermogravity was 1.7%, which was smaller than those in Comparative Examples 1, 2 and 3. Therefore, it was confirmed that even if the CF film was deposited using $H_2$ the thin-film deposition gas in place of the hydrocarbon gas, the thermostability of the CF film was enhanced in comparison with the case where Ne gas was used.

Another example of this preferred embodiment will be described below. When Ne gas is used as the plasma producing gas as described above, there is an advantage in that it is possible to enhance the thermostability of the CF film. However, there are some cases where no plasma is produced unless a few seconds or about 10 seconds elapse after the microwave power is applied (the introduction of Ne gas begins). In order to improve this point, this example is carried out. This example is characterized in that a mixed gas of Ne gas and Ar gas, a mixed gas of Ne gas and Kr gas, or a mixed gas of Ne gas and Xe gas is introduced as the plasma producing gas at least when a plasma is produced.

A case where $C_4F_8$ gas and $C_2H_4$ gas are used as the thin-film deposition gases in this preferred embodiment will be specifically described on the basis of a sequence of FIG. 17. First, Ne gas and Ar gas were substantial simultaneously introduced into the plasma thin-film deposition system shown in FIG. 1. Substantially at the same time, the application of a microwave power is carried out to produce a plasma. Subsequently, a predetermined time, e.g., 30 seconds, after the introduction of Ne gas, the application of a bias power and the introduction of $C_4F_8$ gas and $C_2H_4$ gas are substantially simultaneously carried out to start a thin-film deposition treatment. At the same time that the thin-film deposition treatment begins, i.e., a predetermined time, e.g., 30 seconds, after the introduction of Ar gas, the introduction of Ar gas is stopped.

As an example of process conditions in this case, the flow rates of Ne gas and Ar gas are 150 sccm and 30 sccm, respectively, and the flow rates of $C_4F_8$ gas and $C_2H_4$ gas are 40 sccm and 30 sccm, respectively. In addition, the microwave power is 2.7 kW, and the bias power is 1.5 kW.

Thus, if a mixed gas of Ne gas and Ar gas is used as the plasma producing gas, there is an advantage in that plasma is easily produced, and a stable thin-film deposition treatment can be carried out. It is considered that the reason for this is as follows. That is, the ionization potential and voltage at the minimum excitation level of Ne are higher than those of Ar, Xe, Kr and H, as can be seen from FIG. 18, which shows the ionization potentials and voltages at the minimum excitation level of hydrogen gas and rare gases.

The fact that the ionization potential and so forth of a gas are high means that the gas is difficult to be activated to form a plasma, and high energy is required to produce a plasma. Therefore, if conditions, such as the microwave power and so forth, are the same, Ne gas is more difficult to produce a plasma than Ar gas and so forth. It is considered that if a mixed gas of Ne gas and Ar gas is introduced when the plasma is produced, the mixed gas is more easily activated to form a plasma by the Penning effect of Ar gas (an effect that if one of gases, which has a slightly higher break-down voltage than that of the other gas, is mixed with the other gas, the break-down voltage decreases) than the case where Ne gas is used alone, since Ar gas has a lower ionization potential than that of Ne gas to be easily activated to form a plasma.

Therefore, if conditions, such as the microwave power and so forth, are the same, when the mixed gas is used, time from the application of a microwave power to the production of a plasma is shorter than that when Ne gas is used alone, so that the plasma is produced in a very short time, e.g., about 1 second. In addition, the production of the plasma is stable, so that it is difficult that the plasma is produced and not produced by turns. Therefore, it is easy to make a process sequence during mass production, so that it is possible to carry out a stable plasma treatment. On the other hand, since the introduction of Ar is stopped at the same time that the thin-film deposition treatment begins, it is possible to inhibit the thermostability of the CF film from being decreased by the sputtering function of Ar gas when the thin-film deposition treatment is carried out Then, examples of experiments, which were carried out in order to confirm advantages of this preferred embodiment, will be described below. Using the plasma treatment system shown in FIG. 1, a CF film having a thickness of 2 $\mu$m was deposited on a wafer 10 by introducing Ne gas and Ar gas as plasma producing gases at flow rates of 150 sccm and 30 sccm, respectively, and $C_4F_8$ gas and $C_2H_4$ gas as thin-film deposition gases at flow rates of 40 sccm and 30 sccm, respectively. In this case, the microwave power and the bias power were set to be 2700 W and 1500 W, respectively. In addition, the introducing and stopping timings of Ne gas, Ar gas and the thin-film deposition gases, and the applying and stopping timings of the milicrowave power and the bias power were the same as those in the sequence of FIG. 17, respectively (Example 3). When the thin-film deposition treatment is carried out, the presence of the production of a plasma was confirmed by the naked eye 3 seconds after the application of the microwave power.

In addition, experiments were carried out when a mixed gas of Ne gas and Kr gas was used as the plasma producing gas to be introduced at flow rates of 150 sccm and 30 sccm, respectively (Example 4), when a mixed gas of Ne gas and Xe gas was used as the plasma producing gas to be introduced at flow rates of 150 sccm and 30 sccm, respectively (Example 5), and when Ne gas was used alone as the plasma producing gas to be introduced at a flow rate of 150 sccm (Comparative Example 4). In these Examples, other conditions were the same as those in Example 3.

The results are shown in FIG. 19. It was confirmed from these results that it took a little time to produce a plasma when the mixed gas of Ne gas and Ar gas was used as the plasma producing gas (Example 3), when the mixed gas of Ne gas and Kr gas was used as the plasma producing gas (Example 4), when the mixed gas of Ne gas and Xe gas was used as the plasma producing gas (Example 5) and when Ne gas was used alone (Comparative Example 4).

As the thin-film deposition gas, there may be used a compound gas of C and F, such as $CF_4$, $C_2F_6$, $C_3F_8$, $C_5F_8$ and $C_6F_6$ gases, and a gas containing C, F and H, such as $CHF_3$ gas. There may also used a hydrocarbon gas, such as $CH_4$, $C_2H_2$, $C_2H_6$, $C_3H_8$ and $C_4H_8$ gases. In place of the hydrocarbon gas, hydrogen gas may be used.

According to this preferred embodiment, the plasma producing method should not be limited to the ECR, but this preferred embodiment may be applied to the production of a plasma called an ICP (Inductive Coupled Plasma) by a method for applying electric and magnetic fields to a process gas from a coil wound onto a dome-shaped container. Moreover, this preferred embodiment may be applied to the production of a plasma called a helicon wave plasma by the interaction between a helicon wave of, e.g., 13.56 MHz, and a magnetic field applied to a magnetic coil, and the production of a plasma called a magnetron plasma by applying a magnetic field to two parallel cathodes substantially in parallel, and the production of a plasma by applying a high-frequency power between electrodes called parallel plates facing each other.

According to the fourth preferred embodiment, it is possible to form a CF film which has high thermostability and small desorption of F containing gases. In addition, if a gas containing neon gas and argon gas, krypton gas or xenon gas is activated to form a plasma, it is easy to produce the plasma, so that it is possible to shorten time to produce the plasma.

The first through fourth preferred embodiments of the preset invention have been described above. According to any one of these preferred embodiments, it is possible to form a CF film which has high thermostability and small desorption of F containing gases. Therefore, if this CF film is used as, e.g., an interlayer dielectric film of a semiconductor device, it is possible to prevent the corrosion of a metal wiring, the swell of an aluminum wiring and the crack of the film. Since the scale down and accelerating of semiconductor devices have been required and since CF films have been widely noticed as insulator films having a small relative dielectric constant, the present invention is effective in the practical use of CF films as insulator films.

What is claimed is:

1. A plasma thin-film deposition method for depositing an interlayer dielectric film on a semiconductor device to produce a multi-layered metallization structure, the method comprising:
   supplying a first gas;
   activating the first gas to form a first plasma;
   supplying a second gas comprising a compound gas of carbon and fluorine, a hydrocarbon gas, and an oxygen-containing gas having at least one gas selected from the group consisting of carbon monoxide, carbon dioxide, oxygen, water, and hydrogen peroxide;
   activating the second gas by the first plasma to form a second plasma; and
   depositing a fluorine-containing carbon film serving as the interlayer dielectric film on a substrate of the semiconductor device with the second plasma,
   wherein oxygen atoms in the oxygen-containing gas substantially react with graphite-like carbon-carbon bonds and/or unreacted substances in the fluorine-containing carbon film to substantially remove the graphite-like carbon-carbon bonds and/or the unreacted substances, so as to increase thermal stability of the fluorine-containing carbon film when compared to the fluorine-containing carbon film formed by the second gas having no oxygen.

2. A plasma thin-film deposition method as set forth in claim 1, wherein the first plasma is activated by an interaction between microwaves and a magnetic field.

3. A plasma thin-film deposition method as set forth in claim 1, wherein the first gas is an inert gas.

4. A plasma thin-film deposition method as set forth in claim 1, wherein the compound gas of carbon and fluorine comprises at least one gas selected from the group consisting of $CF_4$, $C_2F_6$, $C_3F_8$, and $C_4F_8$.

5. A plasma thin-film deposition method as set forth in claim 1, wherein the second gas further comprises $C_4F_8$ and $C_2H_4$.

6. A plasma thin-film deposition method as set forth in claim 1, wherein the hydrocarbon gas comprises at least one gas selected from the group consisting of $C_2H_4$, $CH_4$, $C_2H_2$, $C_2H_6$, $C_4H_8$, and $C_3H_8$.

7. A plasma thin-film deposition method for depositing an interlayer dielectric film on a semiconductor device to produce a multi-layered metallization structure, the method comprising:
   supplying a first gas comprising $C_4F_8$ and acetylene with a volume flow ratio of $C_4F_8$ to acetylene ranging from 7/10 to 4/3;
   adding hydrogen gas to the first gas with a volume flow ratio of the first gas to the hydrogen gas ranging from 1 to 3; and
   activating a mixture of the first gas and the hydrogen gas to form a plasma,
   whereby a fluorine-containing carbon film serving as the interlayer dielectric film is formed on a substrate of the semiconductor device by the plasma, and
   wherein hydrogen atoms produced by activating hydrogen gas in the plasma substantially react with fluorine atoms weakly bonded in the fluorine-containing carbon film to remove the weakly-bonded fluorine atoms from the fluorine-containing carbon film, thereby increasing thermal stability of the fluorine-containing film when compared to the fluorine-containing carbon film formed by the first gas and the hydrogen gas with the volume flow ratio of the first gas to the hydrogen gas being less than 1 or greater than 3.

8. A plasma thin-film deposition method for depositing an interlayer dielectric film on a semiconductor device to produce a multi-layered metallization structure, the method comprising:
   supplying a first gas comprising neon;
   activating the first gas to form a first plasma;
   supplying a second gas comprising a compound gas of carbon and fluorine at a predetermined time after the supplying of the first gas; and
   activating the second gas by the first plasma to form a second plasma,
   whereby a fluorine-containing carbon film serving as the interlayer dielectric film is formed on a substrate of the semiconductor device by the second plasma,
   wherein neon atoms substantially reduce a sputtering effect on the fluorine-containing carbon film, so as to increase thermal stability of the fluorine-containing carbon film when compared to the fluorine-containing carbon film formed by the first gas having argon, krypton, or xenon.

9. A plasma thin-film deposition method as set forth in claim 8, wherein the second gas comprises a hydrocarbon gas.

10. A plasma thin-film deposition method as set forth in claim 8, further comprising introducing argon gas to the first gas when activating the first plasma.

11. A plasma thin-film deposition method as set forth in claim 8, further comprising introducing krypton gas to the first gas when activating the first plasma.

12. A plasma thin-film deposition method as set forth in claim 8, further comprising introducing xenon gas to the first gas when activating the first plasma.

13. A plasma thin-film deposition method as set forth in claim 8, wherein activating the first gas is carried out substantially simultaneously with supplying the first gas.

14. A plasma thin-film deposition method as set forth in claim 8, wherein activating the second gas is carried out substantially simultaneously with supplying the second gas.

15. A plasma thin-film deposition method as set forth in claim 8, wherein the compound gas of carbon and fluorine is $C_4F_8$.

16. A plasma thin-film deposition method as set forth in claim 8, wherein the second gas further comprises at least one hydrocarbon gas selected from the group consisting of $C_2H_4$, $CH_4$, $C_2H_2$, $C_2H_6$, $C_4H_8$, and $C_3H_8$.

17. A plasma thin-film deposition method as set forth in claim 8, wherein the second gas further comprises at least one oxygen-containing gas selected from the group consisting of $CO$, $CO_2$, $O_2$, $H_2O$, and $H_2O_2$.

* * * * *